US011901214B2

(12) United States Patent
Park et al.

(10) Patent No.: US 11,901,214 B2
(45) Date of Patent: Feb. 13, 2024

(54) WAFER PROCESSING APPARATUS AND METHOD OF CONTROLLING THE SAME

(71) Applicant: ZEUS CO., LTD., Hwaseong-si (KR)

(72) Inventors: Ji Ho Park, Hwaseong-si (KR); Woon Kong, Cheonan-si (KR); Ung Jo Moon, Osan-si (KR); Ki Hun Park, Hwaseong-si (KR)

(73) Assignee: ZEUS CO., LTD., Hwaseong-si (KR)

( * ) Notice: Subject to any disclaimer, the term of this patent is extended or adjusted under 35 U.S.C. 154(b) by 0 days.

(21) Appl. No.: 17/704,648

(22) Filed: Mar. 25, 2022

(65) Prior Publication Data

US 2022/0310439 A1    Sep. 29, 2022

(30) Foreign Application Priority Data

Mar. 26, 2021 (KR) .................. 10-2021-0039215

(51) Int. Cl.
*H01L 21/683* (2006.01)
*B25B 11/00* (2006.01)

(52) U.S. Cl.
CPC ........ *H01L 21/6838* (2013.01); *B25B 11/005* (2013.01)

(58) Field of Classification Search
CPC ......... B25B 11/00; B25B 11/005; B23Q 3/00; B23Q 3/088; H01L 21/6838; H01L 21/67051; H01L 21/68721; H01L 21/68792; H01L 21/68764
USPC ................................. 269/20, 21, 35; 29/559
See application file for complete search history.

(56) References Cited

U.S. PATENT DOCUMENTS

| 8,777,198 | B2 * | 7/2014 | Sekimoto .......... H01L 21/67086 |
| | | | 269/21 |
| 9,788,464 | B2 * | 10/2017 | Sugi .................. H01L 21/68764 |
| 2014/0061962 | A1 * | 3/2014 | Lane ...................... B29C 66/90 |
| | | | 264/40.3 |
| 2016/0300751 | A1 | 10/2016 | Albert et al. |
| 2018/0135198 | A1 * | 5/2018 | Ogata .................. C25D 17/001 |
| 2019/0203373 | A1 | 7/2019 | Fujikata |

FOREIGN PATENT DOCUMENTS

| JP | 5775339 B2 * | 9/2015 |
| KR | 10-2016-0122067 | 10/2016 |

OTHER PUBLICATIONS

JP5775339—Machine Translation (Year: 2015).*

* cited by examiner

*Primary Examiner* — Lee D Wilson
*Assistant Examiner* — Alberto Saenz
(74) *Attorney, Agent, or Firm* — KILE PARK REED & HOUTTEMAN PLLC

(57) ABSTRACT

The disclosed wafer processing apparatus includes a vacuum chuck unit configured to adsorb and support a wafer assembly including a wafer; a rotary chuck unit configured to rotate the vacuum chuck unit; a rotating shaft connected to the rotary chuck unit to rotate the rotary chuck unit; a ring cover unit configured to press the wafer assembly such that a processing solution sprayed onto the wafer is not diffused into the vacuum chuck unit; a sealing ring installed in the vacuum chuck unit and configured to support the wafer assembly; and a medium supply unit configured to supply an inspection medium to the vacuum chuck unit such that the inspection medium for identifying damage to the sealing ring flows into the sealing ring.

20 Claims, 26 Drawing Sheets

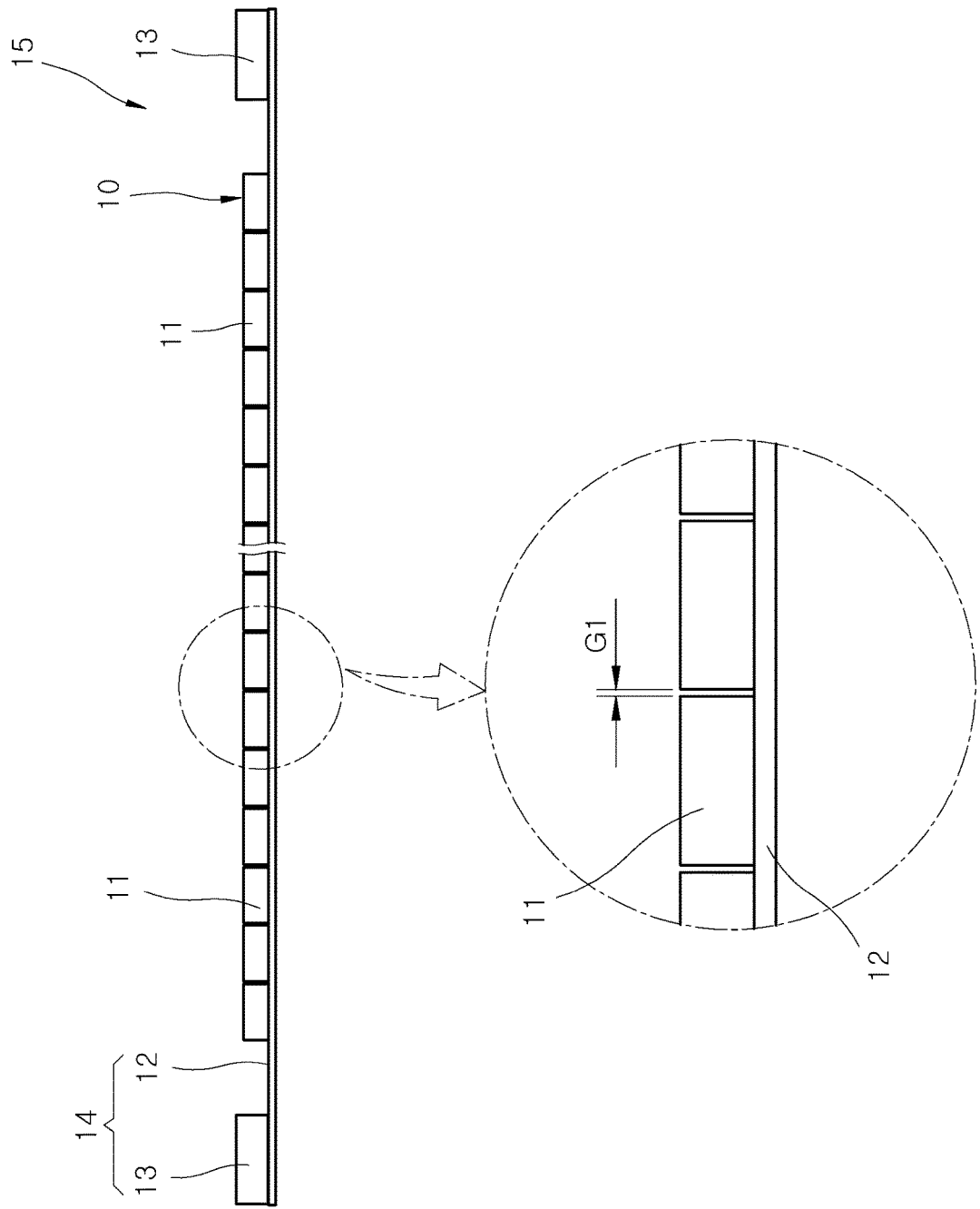

WAFER PROCESSING APPARATUS AND METHOD OF CONTROLLING THE SAME

CROSS-REFERENCE TO RELATED APPLICATION

This application claims the benefit under 35 U.S.C. § 119(a) of Korean Patent Application No. 10-2021-0039215, filed on Mar. 26, 2021 in the Korean Intellectual Property Office, the entire disclosure of which is incorporated herein by reference for all purposes.

BACKGROUND

Technical Field

The present invention relates to a wafer processing apparatus, using which a processing solution is sprayed onto a wafer to process the wafer, and a method of controlling the same.

Discussion of the Background

In general, in a semiconductor process, an etching process of etching wafers, a singulation process of sawing the wafers into a plurality of dies, and a cleaning process of cleaning the wafers are performed. A wafer processing apparatus is used in the wafer etching process or the cleaning process.

The wafer processing apparatus includes a rotary table which is rotatably installed and on which a wafer is mounted, and a sealing ring coupled to an edge area of the rotary table in a ring shape. A processing solution is supplied onto the wafer mounted on the rotary table in a state in which the rotary table rotates. In the conventional wafer processing apparatus, since it is difficult to accurately determine whether a sealing ring is damaged, the sealing ring has been periodically replaced. Accordingly, maintenance costs of the wafer processing apparatus can increase.

In addition, a process of coupling a sealing ring to an upper portion of a rotary table is cumbersome, and a coupling completion state of the sealing ring is not constant when the sealing ring is coupled, resulting in a coupling error (distortion or the like). Furthermore, when the coupling error of the sealing ring is caused, a processing solution may permeate into a part outside the sealing ring, and thus a structure of an outer peripheral portion of the table may be damaged. In addition, a wafer fixing module is installed to prevent a position of the wafer from being shifted, and a sealing ring fixing module is installed to fix the sealing ring. Accordingly, the structure of the wafer processing apparatus may become complicated, and manufacturing costs can increase.

A background technique of the present invention is disclosed in Korean Patent Publication No. 10-2016-0122067 (published on Oct. 21, 2016, and titled "Wafer processing apparatus and sealing ring for wafer processing apparatus").

SUMMARY OF THE INVENTION

The present invention is directed to providing a wafer processing apparatus, in which whether a sealing ring is damaged is easily and quickly identifiable, and a method of controlling the same.

The present invention is also directed to providing a wafer processing apparatus including a rotary joint which is coupled to a rotating shaft of the wafer processing apparatus and has one or more vacuum connection flow paths and one or more press connection flow paths therein, and a method of controlling the same.

According to an aspect of the present invention, there is provided a wafer processing apparatus including a vacuum chuck unit configured to adsorb and support a wafer assembly including a wafer, an adhesive sheet attached to the wafer to support the wafer, and a retainer ring portion coupled to an outer peripheral portion of the adhesive sheet, a rotary chuck unit configured to rotate the vacuum chuck unit and the wafer assembly supported on the vacuum chuck unit, a rotating shaft connected to the rotary chuck unit to rotate the rotary chuck unit, a ring cover unit configured to press the adhesive sheet between the wafer and the retainer ring portion supported on the vacuum chuck unit such that a processing solution sprayed onto the wafer is not diffused into an outer peripheral portion of the vacuum chuck unit, a sealing ring installed in the vacuum chuck unit and configured to support the adhesive sheet pressed by the ring cover unit, and a medium supply unit configured to supply an inspection medium to the vacuum chuck unit such that the inspection medium for identifying damage of the sealing ring flows into the sealing ring.

A vacuum flow path for forming vacuum pressure in the vacuum chuck unit and a vertical medium flow path for supplying a fluid medium to the sealing ring may be formed in the rotating shaft, and the wafer processing apparatus may further include a rotary joint including a rotating core connected to a lower end of the rotating shaft to rotate together with the rotating shaft and a fixed core configured to surround the rotating core and rotatably support the rotating core.

A vacuum connection flow path fluidly connected to a lower end of the vacuum flow path and a press connection flow path fluidly connected to a lower end of the vertical medium flow path may be formed in the rotary joint, a fluid flowing into the vacuum connection flow path from the vacuum flow path may be discharged outward from the rotary joint through a lower surface of the fixed core, and a fluid flowing into the vertical medium flow path from the press connection flow path may flow into the rotary joint through the lower surface of the fixed core.

The vacuum connection flow path may include a first vertical vacuum flow path extending in a vertical direction inside the rotating core and having an upper end that is open toward an upper surface of the rotating core, a first horizontal vacuum flow path connected to a lower end of the first vertical vacuum flow path and extending in a horizontal direction toward an outer circumferential surface of the rotating core, a second vertical vacuum flow path extending in the vertical direction inside the fixed core and having a lower end that is open toward the lower surface of the fixed core, and a second horizontal vacuum flow path connected to an upper end of the second vertical vacuum flow path and extending in the horizontal direction toward an inner circumferential surface of the fixed core to be connected to the first horizontal vacuum flow path.

The press connection flow path may include a first vertical press flow path extending in the vertical direction inside the rotating core and having an upper end that is open toward the upper surface of the rotating core, a first horizontal press flow path connected to a lower end of the first vertical press flow path and extending in the horizontal direction toward the outer circumferential surface of the rotating core, a second vertical press flow path extending in the vertical direction inside the fixed core and having a lower end that is open toward the lower surface of the fixed core, and a second horizontal press flow path connected to an upper end of the second vertical press flow path and extending in the horizontal direction toward the inner circumferential surface of the fixed core to be connected to the first horizontal press flow path, and the vacuum connection flow path and the press connection flow path may not intersect each other.

An annular groove recessed inward from the outer circumferential surface of the rotating core may be formed in each of the first horizontal vacuum flow path and the first horizontal press flow path.

The vacuum connection flow path may be provided as a plurality of vacuum connection flow paths which do not intersect each other inside the rotary joint, and the press connection flow path may be provided as a plurality of press connection flow paths which do not intersect each other inside the rotary joint.

At least one of the plurality of press connection flow paths may be connected to the medium supply unit such that the inspection medium flows through the lower surface of the fixed core to be discharged through the upper surface of the rotating core.

The rotary joint may further include a vacuum flow path packing with an annular shape which is installed on the inner circumferential surface of the fixed core such that vacuum pressure of the vacuum connection flow path is prevented from being weakened due to a fluid flowing into the vacuum connection flow path between the first horizontal vacuum flow path and the second vacuum horizontal flow path.

A vacuum flow path packing seating groove, which is recessed in an annular shape, may be formed in the inner circumferential surface of the fixed core, the vacuum flow path packing may include a body portion which is inserted and seated in the vacuum flow path packing seating groove and has a through-hole formed such that the second horizontal vacuum flow path is not closed, and a lip portion which protrudes from the body portion toward the outer circumferential surface of the rotating core to be in contact with the outer circumferential surface of the rotating core without closing the first horizontal vacuum flow path, and in a direction toward the outer circumferential surface of the rotating core in the horizontal direction, the lip portion of the vacuum flow path packing may protrude in the vertical direction to be inclined in a direction away from the first horizontal vacuum flow path.

The rotary joint may further include a press flow path packing with an annular shape which is installed on the inner circumferential surface of the fixed core such that pneumatic pressure of the press connection flow path is prevented from being weakened due to a fluid leaking outward from the press connection flow path between the first horizontal press flow path and the second horizontal press flow path.

A press flow path packing seating groove, which is recessed in an annular shape, may be formed in the inner circumferential surface of the fixed core, the press flow path packing may include a body portion which is inserted and seated in the press flow path packing seating groove and has a through-hole formed such that the second horizontal press flow path is not closed, and a lip portion which protrudes from the body portion toward the outer circumferential surface of the rotating core to be in contact with the outer circumferential surface of the rotating core without closing the first horizontal pres flow path, and in a direction toward the outer circumferential surface of the rotating core in the horizontal direction, the lip portion of the press flow path packing may protrude in the vertical direction to be inclined in a direction toward the first horizontal press flow path.

The rotating core may include a ceramic coating layer stacked on an outer circumferential surface thereof to reduce friction when the rotating core rotates with respect to the fixed core.

The fixed core may include a plurality of annular blocks stacked to surround the rotating core.

The rotary joint may further include a cooling case configured to surround an outer circumferential surface of the fixed core such that a cooling flow path, in which a refrigerant flows, is formed between the cooling case and the fixed core.

A refrigerant circulation flow path, which is connected to the cooling flow path and passes through the fixed core such that a refrigerant flows, may be formed inside the fixed core.

The medium supply unit may include a medium supply pipe connected to the vacuum chuck unit to supply the inspection medium to the vacuum chuck unit, and a pressure detection unit configured to measure pressure of the medium supply pipe.

The medium supply unit may further include a flow rate detection unit configured to measure a flow rate of the inspection medium supplied from the medium supply pipe to the vacuum chuck unit.

The wafer processing apparatus may further include a rotary chuck unit configured to rotate the vacuum chuck unit and the wafer assembly supported by the vacuum chuck unit, and a chucking module which is installed in the rotary chuck unit, positions and fixes the wafer assembly onto the vacuum chuck unit, and lowers the ring cover unit such that the ring cover unit presses the adhesive sheet between the retainer ring portion and the wafer.

The chucking module may include a chucking base installed in the rotary chuck unit, a chucking rotating part connected to the chucking base to rotate the chucking base, a plurality of first chucking link parts that move radially when the chucking base rotates, a plurality of wafer assembly restraining parts connected to the plurality of first chucking link parts and configured to press the retainer ring portion to be positioned and fixed to the vacuum chuck unit as the plurality of first chucking link parts move radially, a plurality of second chucking link parts that move radially when the chucking base rotates, and a plurality of cover restraining parts connected to the plurality of second chucking link parts and the ring cover unit to move the ring cover unit upward or downward in conjunction with movement of the plurality of second chucking link parts, wherein, when the chucking base rotates, the plurality of first chucking link parts and the plurality of second chucking link parts simultaneously move radially.

The sealing ring may include a sealing member which is accommodated in a sealing groove formed in the vacuum chuck unit and has a deformable space formed therein, a restraining ring portion installed in the sealing groove to fix the sealing member, and a connector portion connected to the deformable space such that the inspection medium is supplied to the deformable space.

In order for an amount of elastic deformation of the sealing member to be increased when the ring cover unit presses the sealing member with the adhesive sheet between the wafer and the retainer ring portion, the sealing member may include at least one of an elastic groove, a tapered portion, a concave portion, a stepped portion, a deformable groove, a round portion, and a convex portion.

According to another aspect of the present invention, there is provided a method of controlling the wafer processing apparatus, the method including an inspection medium supply operation of driving the medium supply unit to supply the inspection medium into the sealing ring, and an inspection medium leakage detection operation of detecting whether the inspection medium supplied into the sealing ring leaks to an outside of the sealing ring.

The method may further include a sealing ring replacement operation of, when leakage of the inspection medium is detected in the inspection medium leakage detection operation, separating and removing the sealing ring from the vacuum chuck unit and installing another sealing ring in the vacuum chuck unit, a wafer mounting operation of fixing and mounting the wafer assembly on the vacuum chuck unit, and a wafer processing operation of spraying the processing solution onto the wafer of the wafer assembly to process the wafer.

The method may further include a wafer mounting operation of, when leakage of the inspection medium is not detected in the inspection medium leakage detection operation, fixing and mounting the wafer assembly on the vacuum chuck unit without replacing the sealing ring, and a wafer processing operation of spraying the processing solution onto the wafer of the wafer assembly to process the wafer.

BRIEF DESCRIPTION OF THE DRAWINGS

FIG. 2 shows schematic side views of the wafer assembly processed in the wafer processing apparatus according to one embodiment of the present invention.

DETAILED DESCRIPTION OF EXEMPLARY EMBODIMENTS

Hereinafter, a wafer processing apparatus and a method of controlling a wafer processing apparatus according to embodiments of the present invention will be described in detail with reference to the accompanying drawings. Terminologies used herein are defined to appropriately describe the exemplary embodiments of the present invention and thus may be changed according to the intent of a user or an operator, or a custom in the field to which the present invention pertains. Accordingly, the terminologies should be defined based on the following overall description of the present specification.

Figure 1:
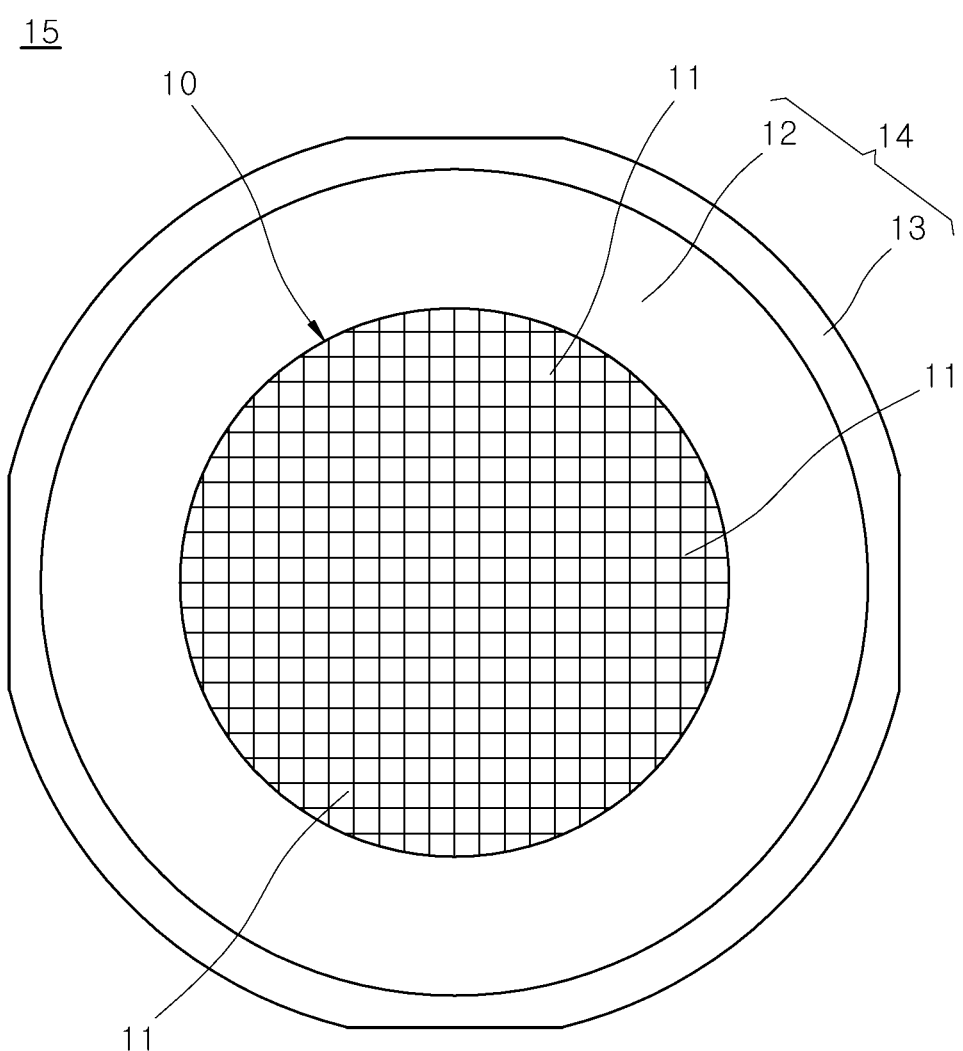
FIG. 1 is a schematic plan view illustrating a wafer assembly processed in a wafer processing apparatus according to one embodiment of the present invention.
Figure 3A:
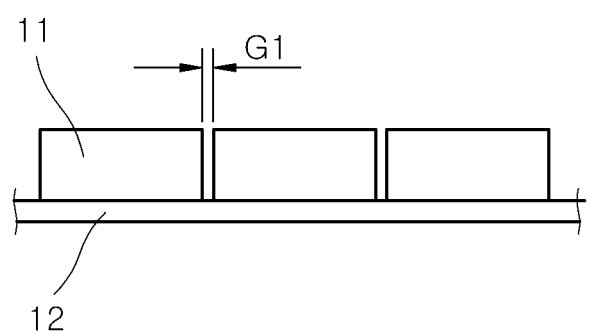
FIGS. 3A and 3B show schematic side views illustrating a state in which gaps between a plurality of dies widen as a vacuum chuck unit is lifted in the wafer processing apparatus according to one embodiment of the present invention.
Figure 3B:
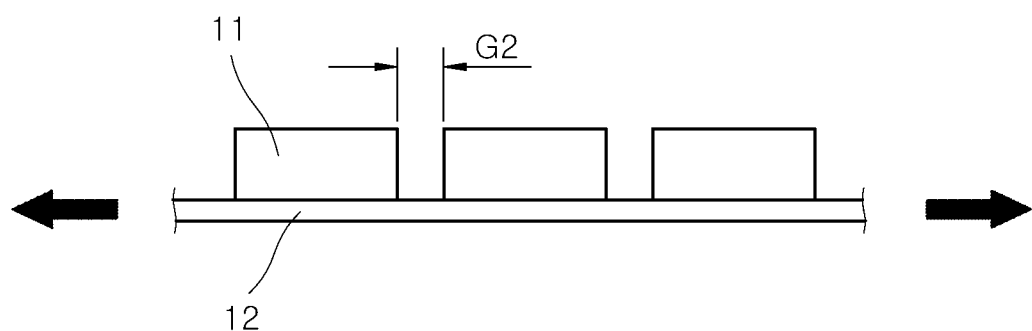
Figure 4:
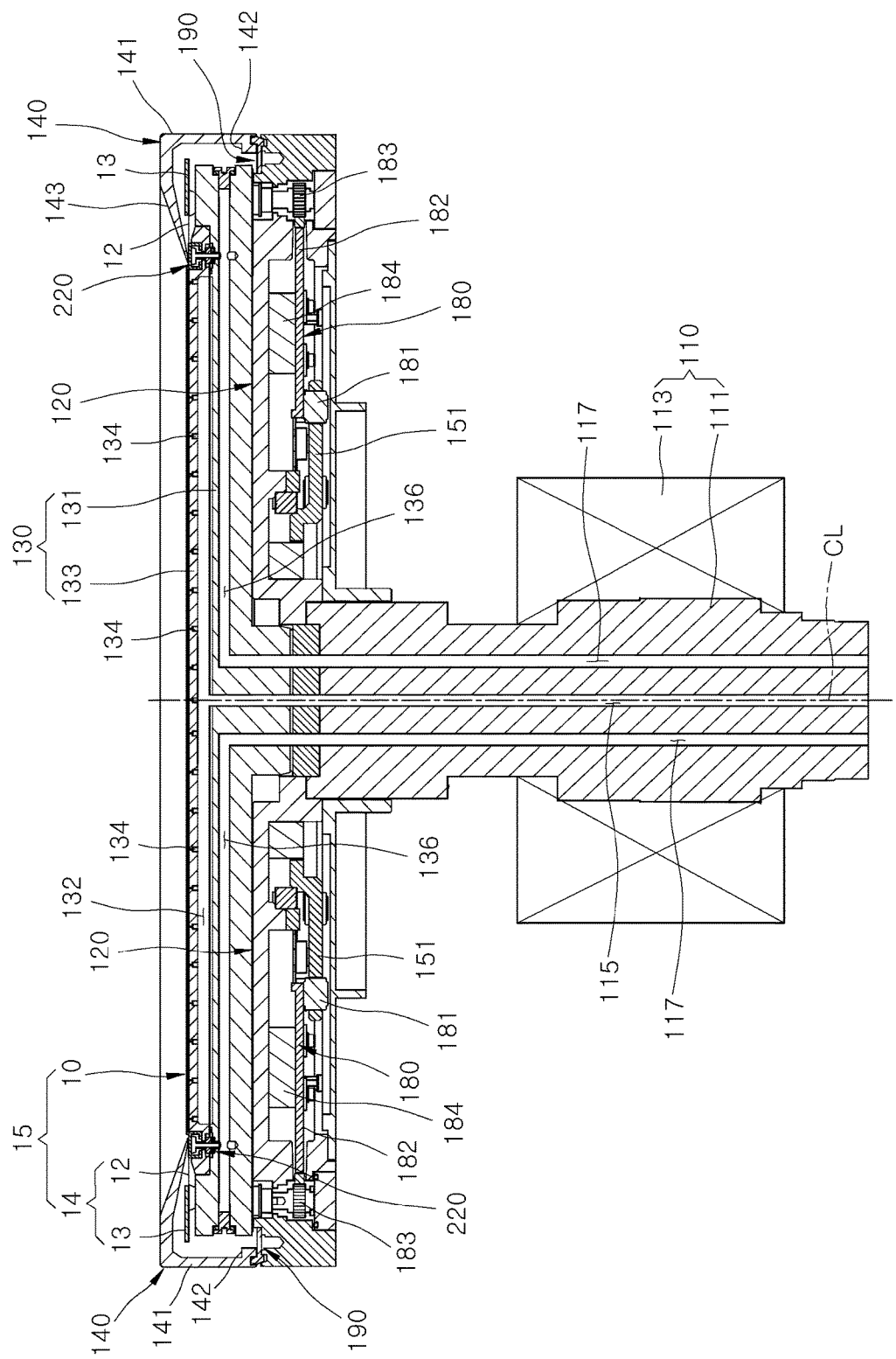
FIG. 4 is a schematic cross-sectional view illustrating the wafer processing apparatus according to one embodiment of the present invention.
Figure 5:
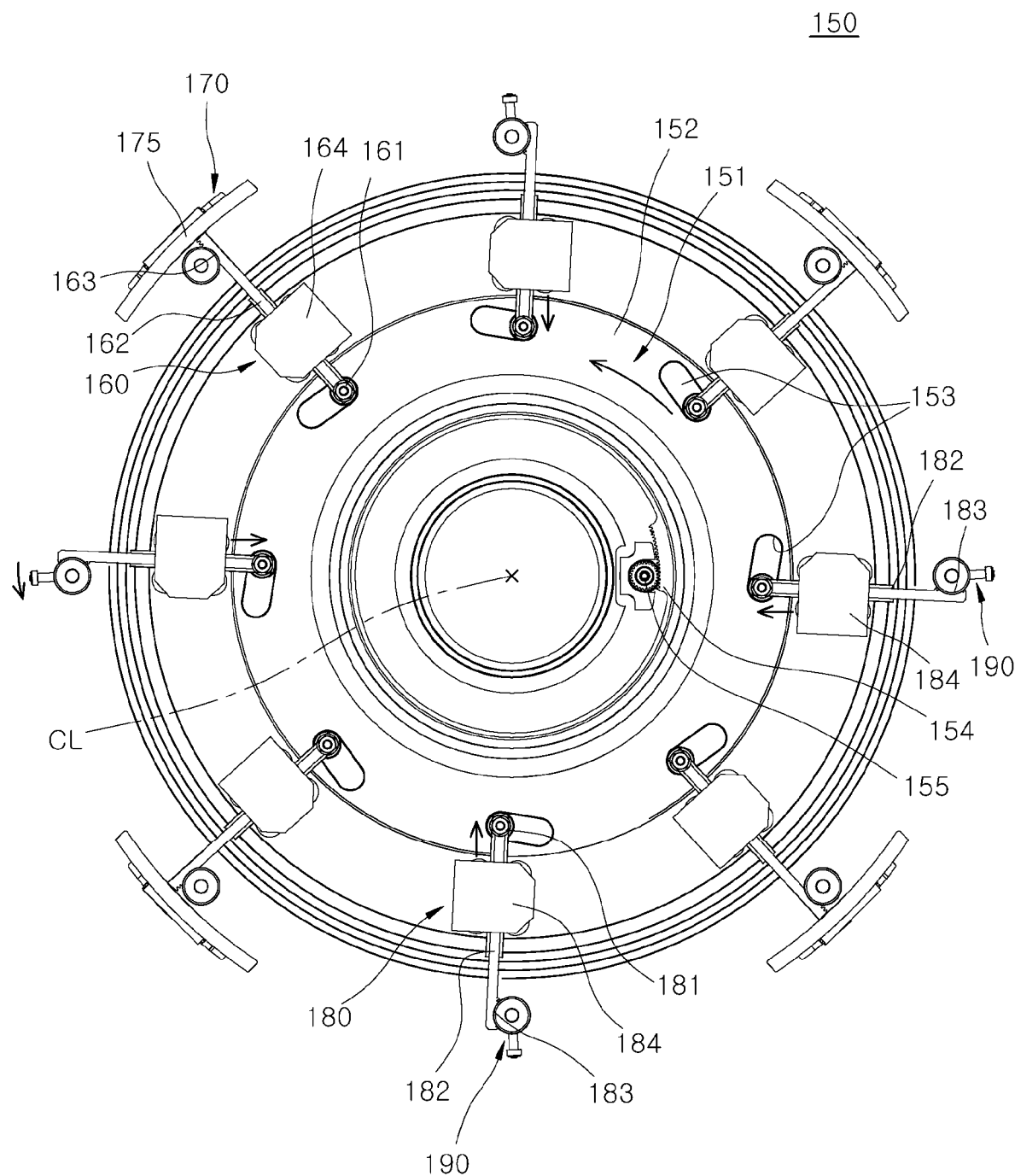
FIG. 5 is a schematic plan view illustrating a chucking module in the wafer processing apparatus according to one embodiment of the present invention.

FIG. 1 is a schematic plan view illustrating a wafer assembly processed in a wafer processing apparatus according to one embodiment of the present invention. FIG. 2 shows schematic side views of the wafer assembly processed in the wafer processing apparatus according to one embodiment of the present invention. FIGS. 3A and 3B show schematic side views illustrating a state in which gaps between a plurality of dies widen as a vacuum chuck unit is lifted in the wafer processing apparatus according to one embodiment of the present invention. FIG. 4 is a schematic cross-sectional view illustrating the wafer processing apparatus according to one embodiment of the present invention. FIG. 5 is a schematic plan view illustrating a chucking module in the wafer processing apparatus according to one embodiment of the present invention.

Referring to FIGS. 1 to 5, the wafer processing apparatus according to one embodiment of the present invention includes a driving unit 110, a rotary chuck unit 120, a vacuum chuck unit 130, a ring cover unit 140, and a medium supply unit 210, and a sealing ring 220. The wafer processing apparatus may be used to etch and clean a wafer 10. In an etching process, an etching solution is sprayed onto a wafer 10. The etched wafer 10 is sawn in a matrix form in a singulation process to form a plurality of dies 11. In a cleaning process, a cleaning solution is sprayed onto the wafer 10 to remove foreign materials attached to the plurality of dies 11. As the cleaning solution, various types of solution such as deionized water (DI-water) may be applied. Hereinafter, the etching solution and the cleaning solution will be collectively referred to as a processing solution.

The wafer 10 is mounted on the wafer processing apparatus in the form of a wafer assembly 15 attached to and supported on a ring frame 14. The wafer 10 includes the plurality of dies 11 arranged in the form of a matrix. The ring frame 14 includes an adhesive sheet 12 to which the wafer 10 is attached, and a retainer ring portion 13 coupled to an outer peripheral portion of the adhesive sheet 12 to pull the adhesive sheet 12 tight (see FIGS. 1 and 2). The adhesive sheet 12 is made of a material that may be stretched or contracted in a horizontal direction. The adhesive sheet 12 is pulled tight by the retainer ring portion 13 so that the plurality of dies 11 of the wafer 10 are positioned and fixed.

The rotary chuck unit 120 is installed to be rotatable by the driving unit 110 (see FIG. 4). The rotary chuck unit 120 rotates the vacuum chuck unit 130 mounted and supported on the rotary chuck unit 120 and the wafer assembly 15 mounted on the vacuum chuck unit 130. The driving unit 110 includes a rotating shaft 111 connected to a rotation center of the rotary chuck unit 120 and a motor unit 113 installed on the rotating shaft 111. The motor unit 113 provides power for rotating the rotating shaft 111 and the rotary chuck unit 120 fixedly supported thereon about an axis CL and includes a stator (not shown) installed inside a housing (not shown) and a rotor (not shown) disposed inside the stator and installed to surround the rotating shaft 111. However, the driving unit 110 provided in the wafer processing apparatus of the present invention is not limited to the configuration shown in FIG. 4 as long as the driving unit 110 provides power for rotating the rotary chuck unit 120. For example, a belt driving type driving unit for rotating the rotating shaft 111 through a belt or a chain driving type driving unit for rotating the rotating shaft 111 through a chain may be applied.

The rotating shaft 111 has a vacuum flow path 115 (see FIG. 4) for forming vacuum pressure in the vacuum chuck unit 130 and a vertical medium flow path 117 for supplying, for example, a fluid medium such as air to the sealing ring 220. The vacuum flow path 115 and the vertical medium flow path 117 each extend in a length direction of the rotating shaft 111 and are spaced apart from each other. The vacuum chuck unit 130 includes a vacuum chamber 132 fluidly connected to the vacuum flow path 115 and a horizontal medium flow path 136 fluidly connected to the vertical medium flow path 117.

The vacuum chuck unit 130 is seated on the rotary chuck unit 120. The wafer assembly 15 is mounted on the vacuum chuck unit 130. A planar shape of the vacuum chuck unit 130 is a disk shape to be seated on an upper portion of the rotary chuck unit 120. The vacuum chuck unit 130 is rotated together with the rotary chuck unit 120 by a driving force of the driving unit 110. When an etching process is performed in the wafer processing apparatus, the wafer assembly 15, which includes the wafer 10 including the plurality of dies 11 in an unsawn state and the ring frame 14 attached to the wafer 10 to support the wafer 10, is mounted on the vacuum chuck unit 130.

Meanwhile, when a cleaning process is performed in the wafer processing apparatus, the wafer assembly 15, which includes the wafer 10 including the plurality of dies 11 in a sawn state and the ring frame 14 attached to the wafer 10 to support the wafer 10, is mounted on the vacuum chuck unit 130. When the wafer 10 is sawn and separated into the plurality of dies 11 through the singulation process, foreign materials may remain on surfaces of the dies 11 and in gaps between the adjacent dies 11. In the cleaning process, the foreign materials on the surfaces of the dies 11 and between the adjacent dies 11 may be removed.

The vacuum chuck unit 130 includes a first vacuum chuck 131 and a second vacuum chuck 133. The first vacuum chuck 131 is installed on the rotary chuck unit 120 to rotate together with the rotary chuck unit 120. As described above, the vacuum chuck unit 130 includes the vacuum chamber 132 fluidly connected to the vacuum flow path 115 and the horizontal medium flow path 136 fluidly connected to the vertical medium flow path 117.

The first vacuum chuck 131 forms vacuum pressure to adsorb the wafer assembly 15. The second vacuum chuck 133 is mounted on the first vacuum chuck 131 to move upward from or downward to the first vacuum chuck 131 by a moving module (not shown). The sealing ring 220 is installed in the second vacuum chuck 133.

A plurality of adsorption holes 134 communicating with the vacuum chamber 132 are formed in the second vacuum chuck 133 to adsorb the wafer assembly 15. The plurality of adsorption holes 134 may be arranged along a concentric circle centered on a center of the second vacuum chuck 133. When vacuum pressure is formed in the vacuum flow path 115 and the vacuum chamber 132 connected thereto, a vacuum suction force is generated in the plurality of adsorption holes 134, and the wafer assembly 15 is stably and closely supported on an upper surface of the second vacuum chuck 133 by the vacuum suction force. Accordingly, the flatness of the wafer 10 may be maintained while an etching process or a cleaning process of the wafer 10 is performed in the wafer processing apparatus.

The ring cover unit 140 is disposed at an outer peripheral portion of the vacuum chuck unit 130. The ring cover unit 140 presses the adhesive sheet 12 of the wafer assembly 15 and seals the outer peripheral portion of the vacuum chuck unit 130 such that the processing solution is not diffused into the outer peripheral portion of the vacuum chuck unit 130. The ring cover unit 140 is connected to a chucking module 150. The ring cover unit 140 is formed in a circular ring shape to press the adhesive sheet 12 of the wafer assembly 15 and seal the outer peripheral portion of the vacuum chuck unit 130, thereby minimizing damage to the adhesive sheet 12 from the processing solution, specifically, the etching solution, and preventing the rotary chuck unit 120 and the vacuum chuck unit 130 from being contaminated or damaged by the etching solution.

The ring cover unit 140 includes a cover body 141 formed to surround the outer peripheral portion of the vacuum chuck unit 130, a restraining stepped portion 142 formed to protrude inward from a lower portion of the cover body 141, and a cover pressing portion 143 which extends inward from an upper side of the cover body 141 and presses the adhesive sheet 12 of the wafer assembly 15. The cover pressing portion 143 presses the adhesive sheet 12 down between the wafer 10 and the retainer ring portion 13. Specifically, the cover pressing portion 143 presses a portion of the adhesive sheet 12 spaced apart from an outermost portion of the wafer 10 by approximately 1 mm in the wafer assembly 15. The cover pressing portion 143 may be formed such that a thickness thereof gradually decreases toward an inner end thereof. Since the portion of the adhesive sheet 12 between the retainer ring portion 13 and the wafer 10 is sealed by the cover pressing portion 143 excluding about 1 mm width of the adhesive sheet 12, damage to the adhesive sheet 12 from the etching solution in the etching process may be prevented.

Before the cleaning solution is sprayed onto the wafer 10 in the cleaning process, the second vacuum chuck 133 on which the wafer assembly 15 is mounted and supported may be lifted with respect to the rotary chuck unit 120 and the first vacuum chuck 131 by the moving module (not shown). When the moving module is driven to lift the second vacuum chuck 133 of the vacuum chuck unit 130, since the first vacuum chuck 131 is not lifted, in a state in which the retainer ring portion 13 of the ring frame 14 is positioned and fixed, only the adhesive sheet 12 is lifted and stretched in a radial direction thereof. As the adhesive sheet 12 is stretched in the radial direction, gaps G2 (see FIGS. 3A and 3B) between the plurality of dies 11 of the wafer 10 widen. In this state, when the cleaning solution is sprayed onto the wafer 10, foreign materials caught in the gaps between the plurality of dies 11 can be quickly and speedily removed.

The wafer processing apparatus further includes the chucking module 150 which is installed in the rotary chuck unit 120, positions and fixes the wafer assembly 15 onto the vacuum chuck unit 130, and lowers the ring cover unit 140 such that the ring cover unit 140 presses the adhesive sheet 12 between the retainer ring portion 13 and the wafer 10. The chucking module 150 includes a chucking base 151, a chucking rotating part 155, a plurality of first chucking link parts 160, a plurality of wafer assembly restraining parts 170, a plurality of second chucking link parts 180, and a plurality of cover restraining parts 190.

The chucking base 151 is installed in the rotary chuck unit 120. The chucking rotating part 155 is connected to the chucking base 151 to rotate the chucking base 151. The plurality of first chucking link parts 160 are each connected to the chucking base 151, extend radially, and move when the chucking base 151 is rotated. The plurality of wafer assembly restraining parts 170 press the retainer ring portion 13 of the wafer assembly 15 to be positioned and fixed to the vacuum chuck unit 130 when the first chucking link parts 160 move radially. Each of the plurality of wafer assembly restraining parts 170 is connected to one of the plurality of first chucking link parts 160. The chucking base 151 is installed to be concentric with the rotary chuck unit 120. The chucking base 151, the chucking rotating part 155, and the first chucking link parts 160 are disposed inside the rotary chuck unit 120.

When the chucking rotating part 155 is driven, as the chucking base 151 is rotated a certain angle, the plurality of first chucking link parts 160 move in a radial direction of the chucking base 151, specifically, toward a center of the chucking base 151. As the plurality of first chucking link parts 160 move simultaneously, the plurality of wafer assembly restraining parts 170 press and fix the retainer ring portion 13 so that vertical alignment of the wafer assembly 15 with respect to the first vacuum chuck 131 is maintained.

The chucking base 151 includes a base body 152, a plurality of guide portions 153, and a base gear portion 154. The base body 152 is formed in an annular shape to be concentric with the rotation center of the rotary chuck unit 120. The base body 152 is disposed inside the rotary chuck unit 120. The plurality of guide portions 153 are formed in the base body 152 such that the first chucking link parts 160 are movably coupled thereto. The number of the plurality of guide portions 153 may be twice the number of the first chucking link parts 160. The plurality of guide portions 153 may be formed at equal angular intervals with respect to a center of the base body 152.

The first chucking link parts 160 are coupled to every other guide portion 153 among the plurality of guide portions 153. The base gear portion 154 is formed in the base body 152 and is connected to the chucking rotating part 155. The base gear portion 154 is disposed to extend along an arc on an inner circumferential surface of the base body 152. When the chucking rotating part 155 is driven, the base gear portion 154 rotates, and the base body 152 rotates together with the base gear portion 154 so that the first chucking link parts 160 move in a radial direction of the base body 152.

The guide portions 153 extend to be inclined with respect to the radial direction of the base body 152. The guide portions 153 may be guide holes. However, the guide portions are not limited to guide holes and may be guide grooves or guide protrusions. Since the guide portions 153 are formed to be inclined with respect to the radial direction of the base body 152, as the base body 152 rotates a certain angle, the first chucking link parts 160 move linearly in the radial direction of the base body 152.

The first chucking link parts 160 include a first guide slider 161, a first link member 162, and a first link gear portion 163. The first guide slider 161 is movably coupled to the guide portions 153. The first link member 162 is connected to the first guide slider 161 and moves linearly in the radial direction of the base body 152 when the first guide slider 161 moves. The first link member 162 is formed in a straight bar shape. The first link gear portion 163 may be formed in the first link member 162 to be engaged with the wafer assembly restraining parts 170. Exemplarily, the first link gear portion 163 may be formed in the form of a rack gear parallel to a length direction of the first link member 162.

The first chucking link parts 160 further include a first guide block 164 to which the first link member 162 is coupled to be linearly movable. The first guide block 164 prevents the first link member 162 from rotating in a circumferential direction of the base body 152 when the base body 152 rotates. Accordingly, when the first guide slider 161 moves along the guide portions 153 when the base body 152 rotates, the first link member 162 may move linearly without rotating.

The wafer assembly restraining parts 170 include a gripper 175 which rotates to press and release the retainer ring portion 13 of the wafer 10 when the first chucking link parts 160 move. The gripper 175 extends in an arc shape to press and fix an outer circumferential surface of the retainer ring portion 13 of the wafer assembly 15.

The plurality of second chucking link parts 180 are each connected to the chucking base 151, extend radially, and move radially when the chucking base 151 rotates. The plurality of cover restraining parts 190 are connected to the second chucking link parts 180 and the restraining stepped portion 142 of the ring cover unit 140. When the chucking rotating part 155 is driven, the base gear portion 154 rotates, and the base body 152 rotates together with the base gear portion 154 so that the second chucking link parts 180 move in the radial direction of the base body 152, specifically, toward the center of the chucking base 151. When the base body 152 of the chucking base 151 rotates, the plurality of first chucking link parts 160 and the plurality of second chucking link parts 180 simultaneously move radially. As the first chucking link parts 160 move, the retainer ring portion 13 of the wafer assembly 15 is positioned and fixed to the vacuum chuck unit 130, and as the second chucking link parts 180 move, the ring cover unit 140 is positioned and fixed by moving downward to press the adhesive sheet 12 between the wafer 10 and the retainer ring portion 13 of the wafer assembly 15 along, for example, a closed curved trajectory such as a circular trajectory. Since the wafer assembly 15 and the ring cover unit 140 are simultaneously positioned and fixed using one chucking base 151 and one chucking rotating part 155, the structure of the wafer processing apparatus can be simplified.

The second chucking link parts 180 include a second guide slider 181 and a second link member 182. The second guide slider 181 is movably coupled to the guide portions 153. The second link member 182 is connected to the second guide slider 181 and moves linearly in the radial direction of the base body 152 when the second guide slider 181 moves.

The second link member 182 is formed in a straight bar shape. The second link gear portion 183 may be formed in the second link member 182 to be engaged with the cover restraining parts 190. Exemplarily, the second link gear portion 183 may be formed in the form of a rack gear parallel to a length direction of the second link gear member 183.

The second chucking link parts 180 further include a second guide block 184 to which the second link member 182 is coupled to be linearly movable. The second guide block 184 prevents the second chucking link parts 180 from rotating in the circumferential direction of the base body 152 when the base body 152 rotates. Accordingly, when the second guide slider 181 moves along the guide portions 153 when the base body 152 rotates, the second link member 182 may move linearly without rotating. The plurality of cover restraining parts 190 are connected to the plurality of second chucking link parts 180 and the restraining stepped portion 142 of the ring cover unit 140 such that the ring cover unit 140 moves upward or downward in conjunction with movement of the second chucking link parts 180.

Figure 6:
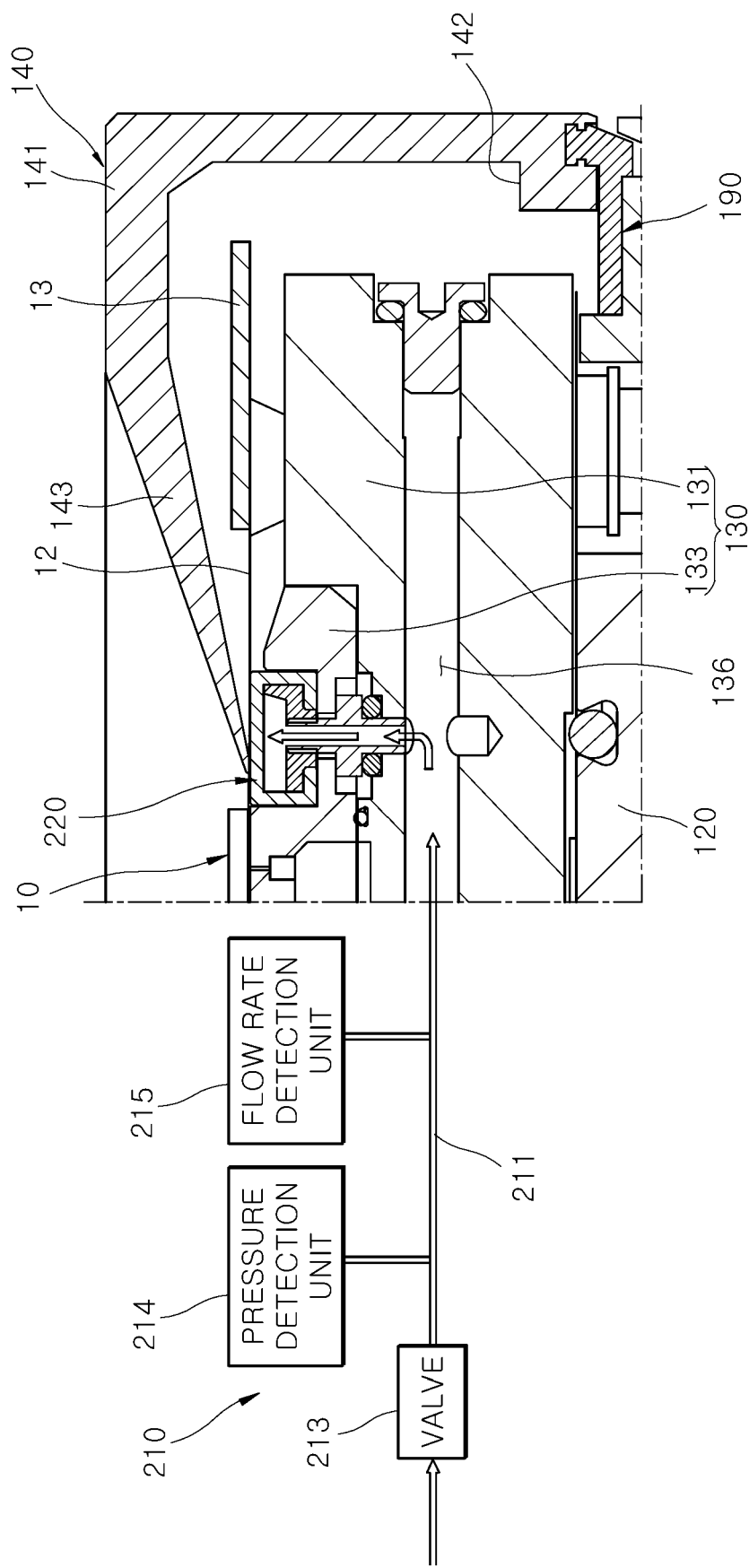
FIG. 6 is a schematic cross-sectional view illustrating a state in which a medium supply unit supplies an inspection medium to the vacuum chuck unit in the wafer processing apparatus according to one embodiment of the present invention.
Figure 7:
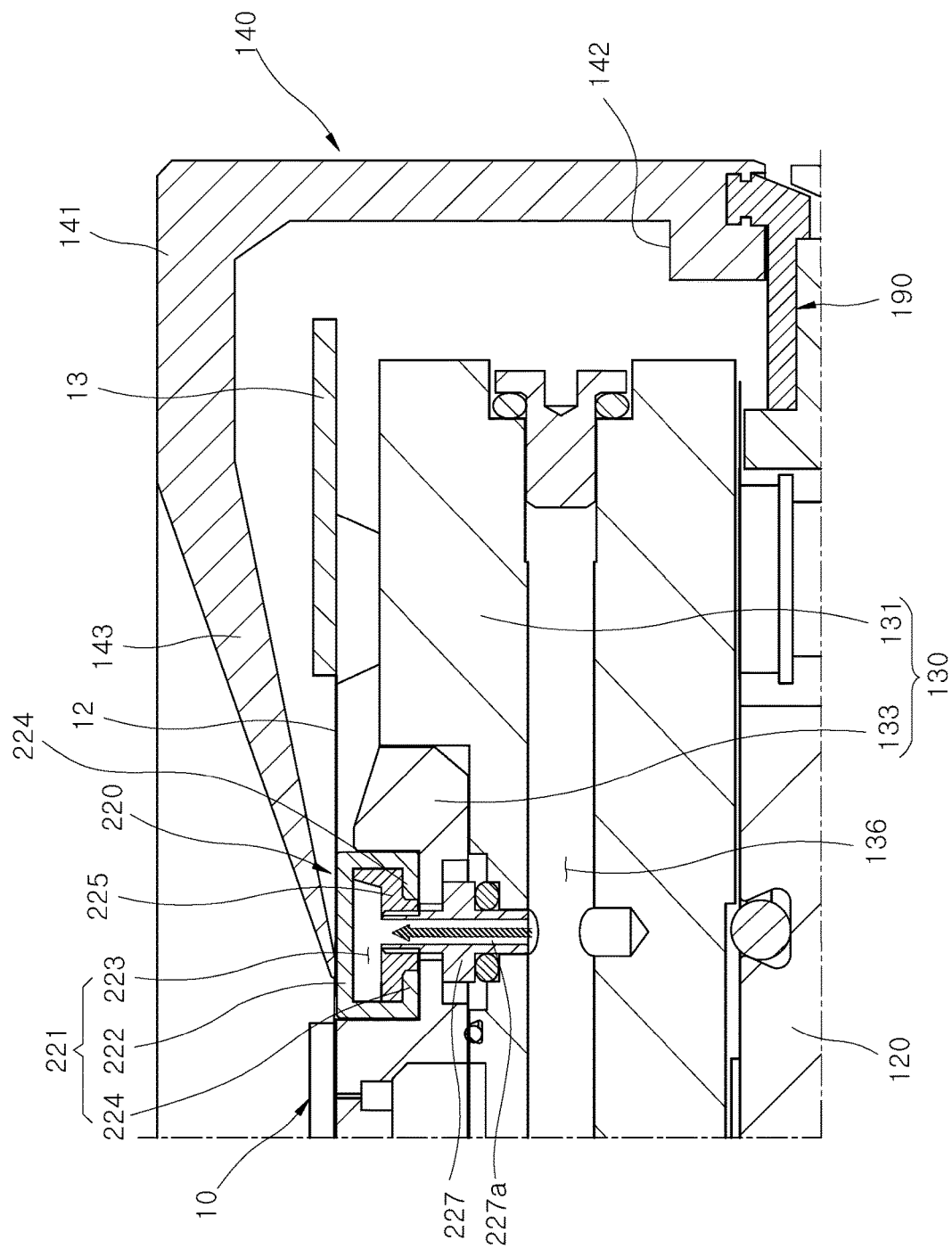
FIG. 7 is a schematic cross-sectional view illustrating a state in which the inspection medium is supplied to a sealing ring in the wafer processing apparatus according to one embodiment of the present invention.

FIG. 6 is a schematic cross-sectional view illustrating a state in which the medium supply unit supplies an inspection medium to the vacuum chuck unit in the wafer processing apparatus according to one embodiment of the present invention, and FIG. 7 is a schematic cross-sectional view illustrating a state in which the inspection medium is supplied to the sealing ring in the wafer processing apparatus according to one embodiment of the present invention.

Referring to FIGS. 6 and 7, the medium supply unit 210 supplies the inspection medium into the vacuum chuck unit 130 and into the sealing ring 220 installed therein. The horizontal medium flow path 136 is formed inside the vacuum chuck unit 130, specifically, inside the first vacuum chuck 131 such that the inspection medium introduced into the vacuum chuck unit 130 from the medium supply unit 210 is supplied to the sealing ring 220. The horizontal medium flow path 136 may be radially formed inside the first vacuum chuck 131 to be connected to a plurality of communication channels 227a provided in the sealing ring 220.

The medium supply unit 210 includes a medium supply pipe 211 which is connected to the vacuum chuck unit to supply the inspection medium, that is, a fluid, into the vacuum chuck unit 130, specifically, to the horizontal medium flow path 136, and a valve 213 installed on the medium supply pipe 211 to open or close a flow path of the medium supply pipe 211. In other words, the horizontal medium flow path 136 is connected to the vertical medium flow path 117 formed to fluidly extend in a vertical direction inside the rotating shaft 111. The medium supply pipe 211 may be connected directly to the horizontal medium flow path 136 or may be connected to the horizontal medium flow path 136 through the vertical medium flow path 117.

When an etching process or a cleaning process of the wafer 10 is being performed in the wafer processing apparatus, a fluid medium such as air is supplied into the sealing ring 220 through the vertical medium flow path 117 and the horizontal medium flow path 136. When a process of processing the wafer 10 using the wafer processing apparatus is not performed, that is, when the wafer processing apparatus is not operated, and the valve 213 is opened, the inspection medium may be supplied to the horizontal medium flow path 136 through the medium supply pipe 211.

The medium supply unit 210 further includes a pressure detection unit 214 installed on the medium supply pipe 211 to measure pressure of the medium supply pipe 211 and a flow rate detection unit 215 which measures a flow rate of the inspection medium supplied from the medium supply pipe 211 to the horizontal medium flow path 136 of the vacuum chuck unit 130. When the pressure of the medium supply pipe 211 is lower than preset reference pressure while the inspection medium is supplied to the medium supply pipe 211, it may be determined that the sealing ring 220 is damaged.

Since the flow rate detection unit 215 measures the flow rate of the inspection medium such that a certain amount of the inspection medium may be supplied to the sealing ring 220, an excessive increase in internal pressure of the sealing ring 220 is prevented. The inspection medium may include a fluorescent material. Accordingly, it is possible to identify the inspection medium leaking from the sealing ring 220 even in a dark place, and thus it is possible to easily identify whether the sealing ring 220 is damaged even in a dark place.

The sealing ring 220 is made of, for example, an elastic material such as rubber, and is installed at the vacuum chuck unit 130 to support the wafer assembly 15. Specifically, the sealing ring 220 supports the adhesive sheet 12 between the wafer 10 and the retainer ring portion 13 of the wafer assembly 15. The inspection medium supplied to the vacuum chuck unit 130 flows into the sealing ring 220. When the sealing ring 220 is partially damaged, the inspection medium leaks to the outside through the damaged portion of the sealing ring 220. In this case, for example, it is possible to easily identify damage to the sealing ring 220 through a sensation felt by an operator when the operator brings his/her fingertip close to the sealing ring 220. Meanwhile, the operator may also identify that the inspection medium leaks from the sealing ring 220 using the separate leakage inspection device (not shown). Whether the sealing ring 220 is damaged may be identified before a process of processing the wafer 10, such as an etching process or a cleaning process using the wafer processing apparatus, is performed.

As described above, whether the inspection medium leaks may be identified to quickly and easily identify whether the sealing ring 220 is damaged. Therefore, a replacement time of the sealing ring 220 can be accurately recognized, thereby reducing maintenance costs of the wafer processing apparatus. In addition, the wafer processing apparatus can be prevented from being contaminated or damaged due to the damage of the sealing ring 220.

The sealing ring 220 includes a sealing member 221, a restraining ring portion 225, and a connector portion 227. The sealing member 221 is accommodated in a sealing groove 137 of the vacuum chuck unit 130, and a deformable space 223 is formed therein. The restraining ring portion 225 is installed in the sealing groove 137 to fix the sealing member 221. The connector portion 227 is connected to the deformable space 223 to supply the inspection medium to the deformable space 223. A cross-sectional shape of the sealing member 221 may be formed as a quadrangular shape with an open lower side. The lower side of the sealing member 221 is fitted into the restraining ring portion 225 and is restrained.

The communication channel 227a is formed in the connector portion 227 to allow the deformable space 223 and the horizontal medium flow path 136 to communicate with each other. The inspection medium supplied to the horizontal medium flow path 136 is supplied to the deformable space 223 of the sealing member 221 through the connector portion 227. Accordingly, whether the inspection medium leaks from the sealing member 221 is detected, thereby accurately identifying a replacement time of the sealing member 221.

FIGS. 8 to 18 are schematic cross-sectional views illustrating various embodiments of a sealing ring in a wafer processing apparatus according to one embodiment of the present invention. Hereinafter, various embodiments of a sealing member 221 included in a sealing ring 220 will be described in detail with sequential reference to the drawings.

Figure 8:
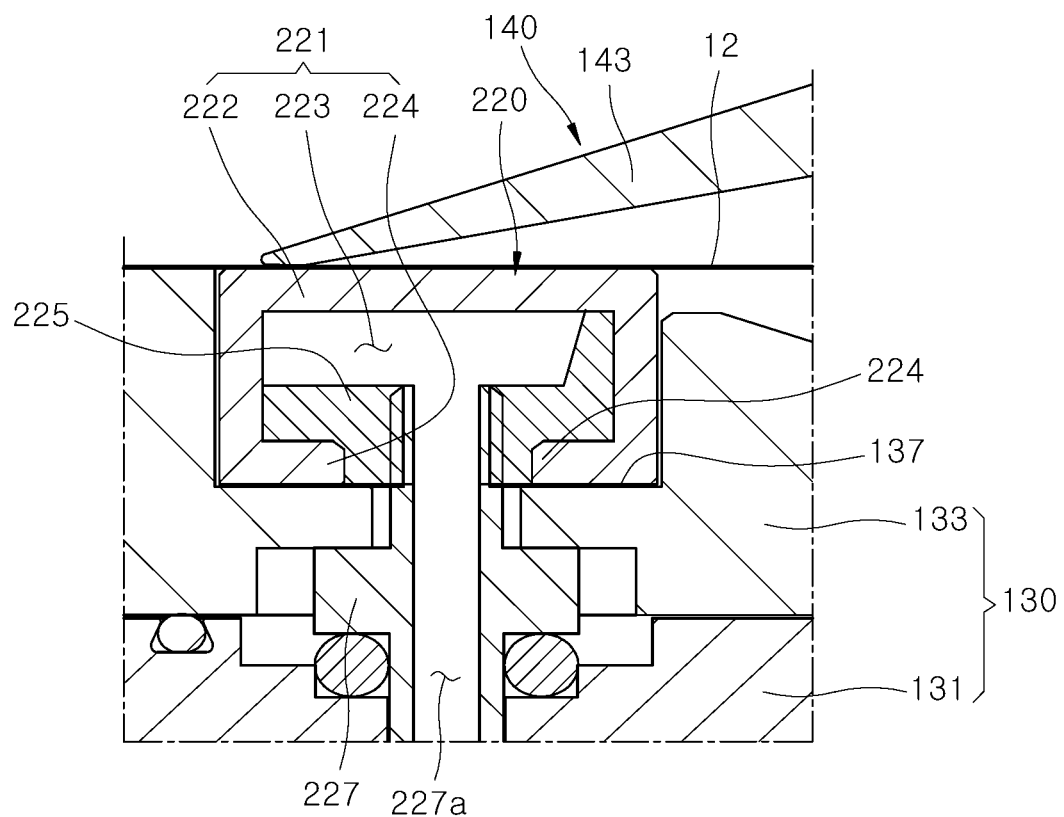
FIGS. 8 to 18 are schematic cross-sectional views illustrating various embodiments of a sealing ring in a wafer processing apparatus according to one embodiment of the present invention.

Referring to FIG. 8, a sealing member 221 includes a sealing body 222 which is accommodated in a sealing groove 137 and has a deformable space 223 formed therein and fixing ribs 224 which are bent to extend from a lower end of the sealing body 222 to a restraining ring portion 225 to be fitted into the restraining ring portion 225. A cross-sectional shape of the sealing body 222 is an approximately inverted letter "U" shape, and the fixing ribs 224 are bent to extend toward each other from both lower ends of the sealing body 222. Since the fixing rib 224 is fitted into the restraining ring portion 225 and is restrained, even when pressure of the deformable space 223 is increased, the sealing member 221 can be prevented from being separated from the restraining ring portion 225.

Since pressure and a flow rate of a medium supply pipe 211 are measured and detected by a pressure detection unit 214 and a flow rate detection unit 215, an operator can identify whether the sealing member 221 is damaged as well as whether an inspection medium properly flows into the sealing ring 220.

Figure 9:
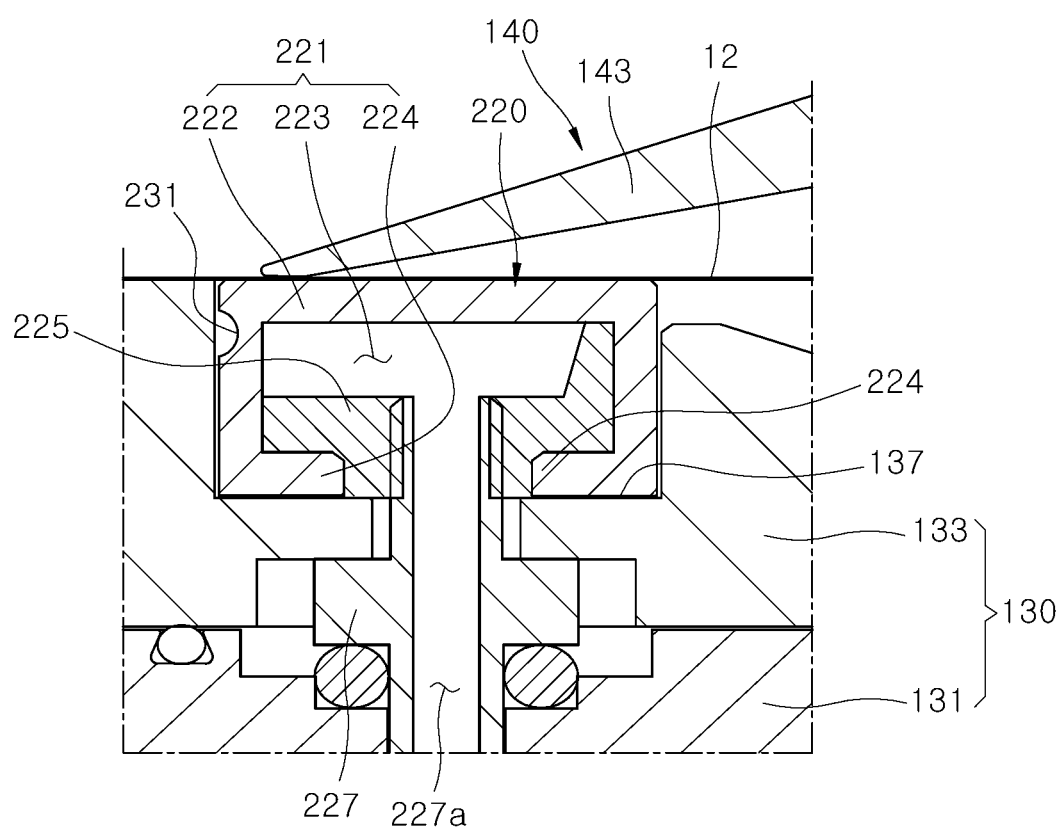
Figure 10:
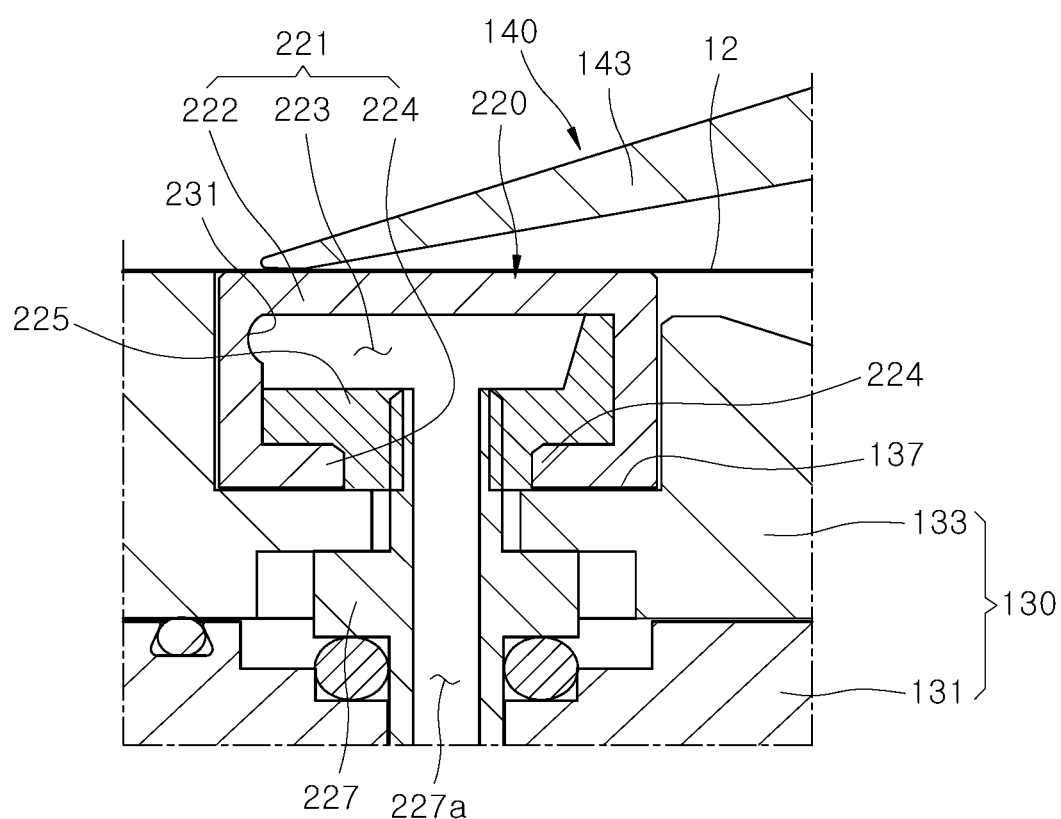
Figure 11:
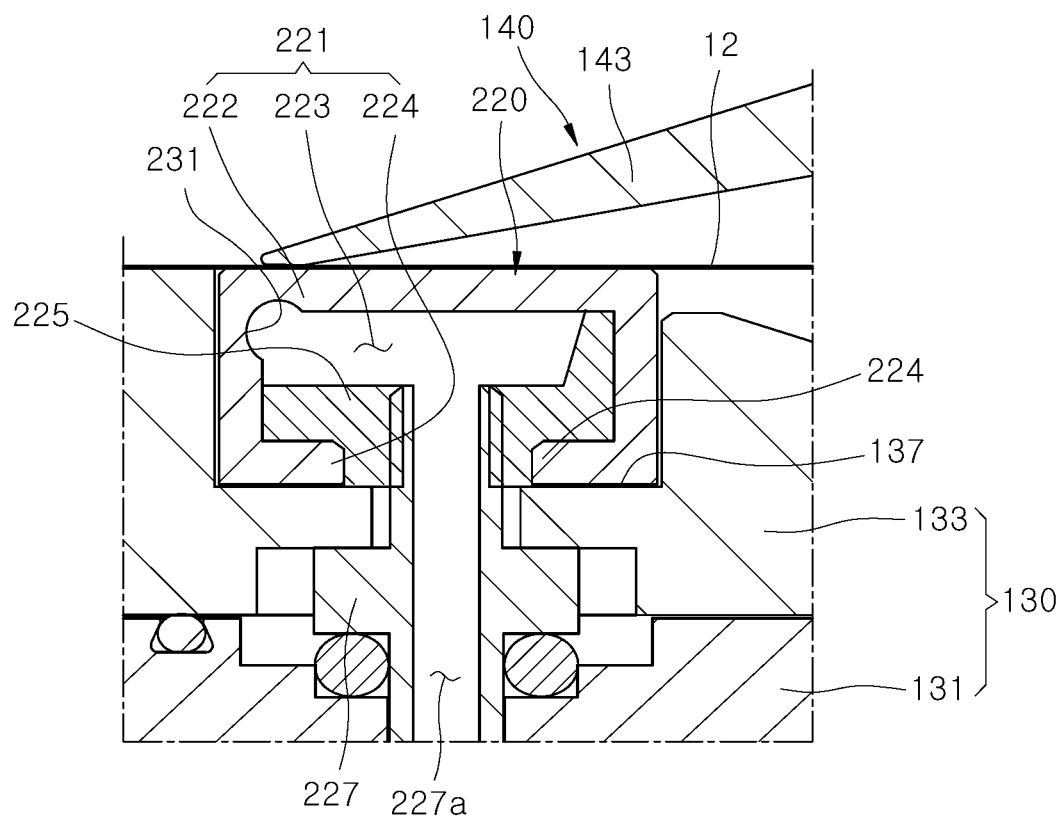

Referring to FIGS. 9 to 11, an elastic groove 231 is formed in an outer surface or an inner surface of a sealing body 222. The elastic groove 231 may be formed at or around an upper edge of the sealing body 222. The elastic groove 231 is formed in a circular shape in a circumferential direction of the sealing body 222. Since the elastic groove 231 is formed, when a cover pressing portion 143 of a ring cover unit 140 presses the sealing body 222 with an adhesive sheet 12 interposed therebetween, the sealing body 222 can be elastically deformed more smoothly. Since an amount of elastic deformation of the sealing body 222 is increased, the adhesive sheet 12 of a wafer assembly 15 is more strongly and elastically pressed against the cover pressing portion 143 by an elastic restoring force of the sealing body 222, and a contact area between the sealing body 222 and the cover pressing portion 143 is increased, thereby improving the sealing performance of the sealing body 222.

Figure 12:
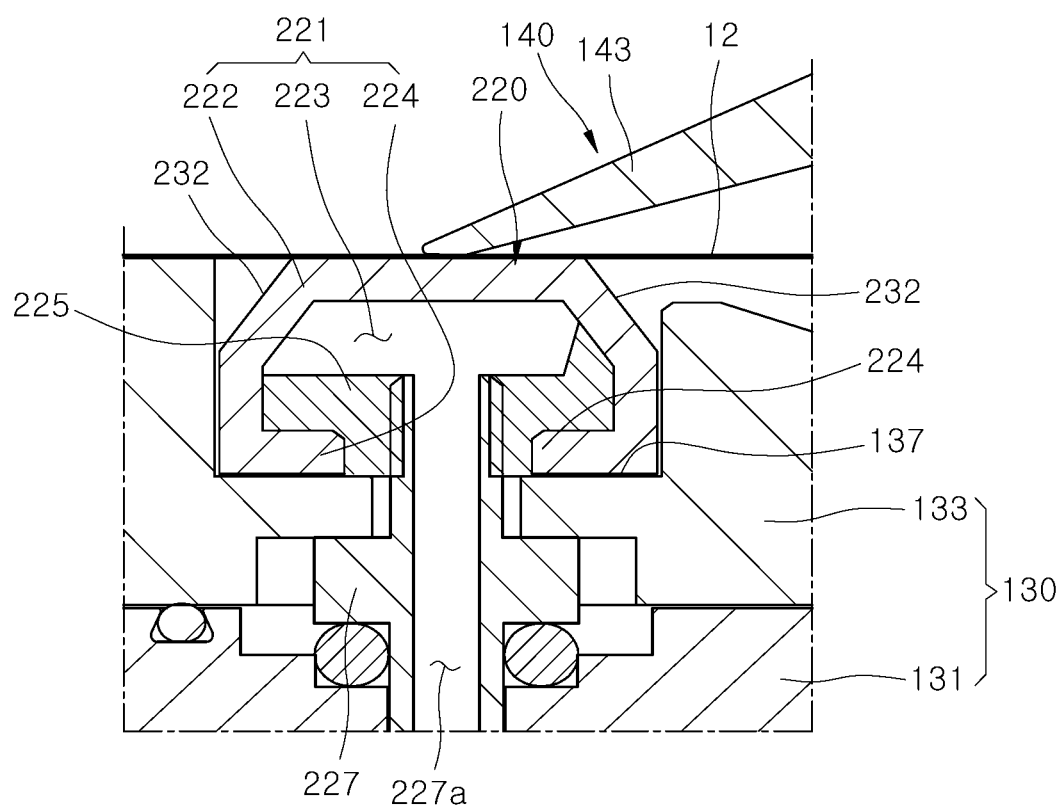

Referring to FIG. 12, tapered portions 232 are formed at an inner circumferential side and an outer circumferential side of a sealing body 222. The tapered portions 232 are formed to be inclined in a downward direction of the inner circumferential side and the outer circumferential side of the sealing body 222. Since an upper end portion of the sealing body 222 can be elastically deformed more smoothly due to the tapered portions 232, an adhesive sheet 12 of a wafer assembly 15 is more strongly and elastically pressed against a cover pressing portion 143 by an elastic restoring force of the sealing body 222, and a contact area between the sealing body 222 and the cover pressing portion 143 is increased, thereby improving the sealing performance of the sealing body 222.

Figure 13:
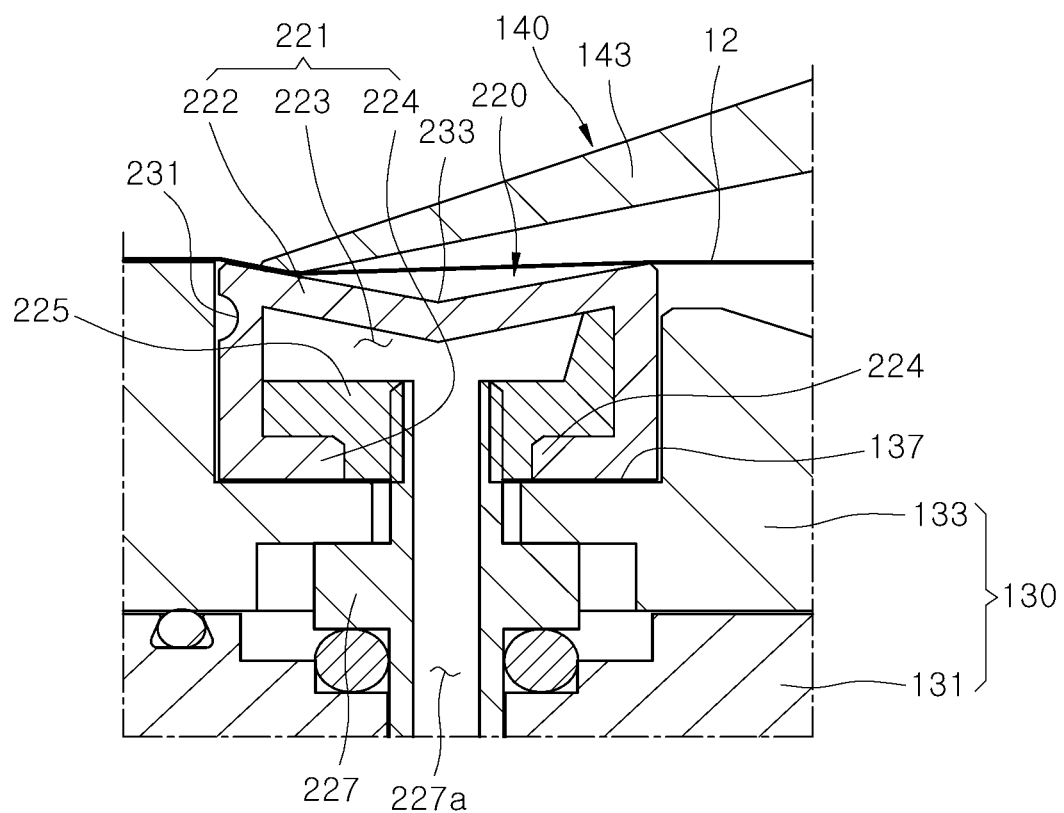
Figure 14:
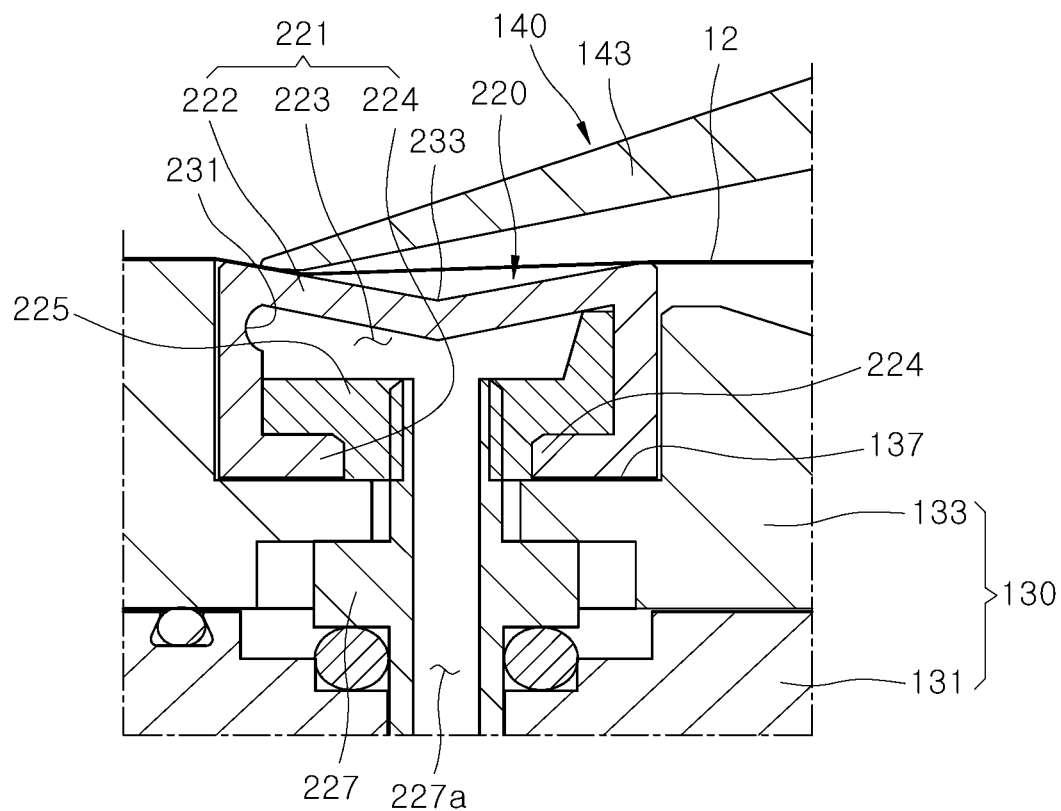

Referring to FIGS. 13 and 14, a concave portion 233 is formed to be concavely recessed from an upper end portion of a sealing body 222. The concave portion 233 may be formed by a central portion of the upper end portion of the sealing body 222 in a width direction thereof being concavely recessed downward. The concave portion 233 is formed in a circular shape in a circumferential direction of the sealing body 222. Since the concave portion 233 is formed on the upper end portion of the sealing body 222, when a cover pressing portion 143 of a ring cover unit 140 presses the sealing body 222 with an adhesive sheet 12 interposed therebetween, an amount of elastic deformation of the sealing body 222 is increased, and a contact area between the sealing body 222 and the cover pressing portion 143 is increased, thereby improving the sealing performance of the sealing body 222.

An elastic groove 231 may be further formed in an outer surface or an inner surface of the sealing body 222. The elastic groove 231 may be formed at or around an upper edge of the sealing body 222. The elastic groove 231 is formed in a circular shape in the circumferential direction of the sealing body 222. Since the concave portion 233 and the elastic groove 231 are simultaneously formed in the sealing body 222, an amount of elastic deformation of the sealing body 222 can be further increased.

Figure 15:
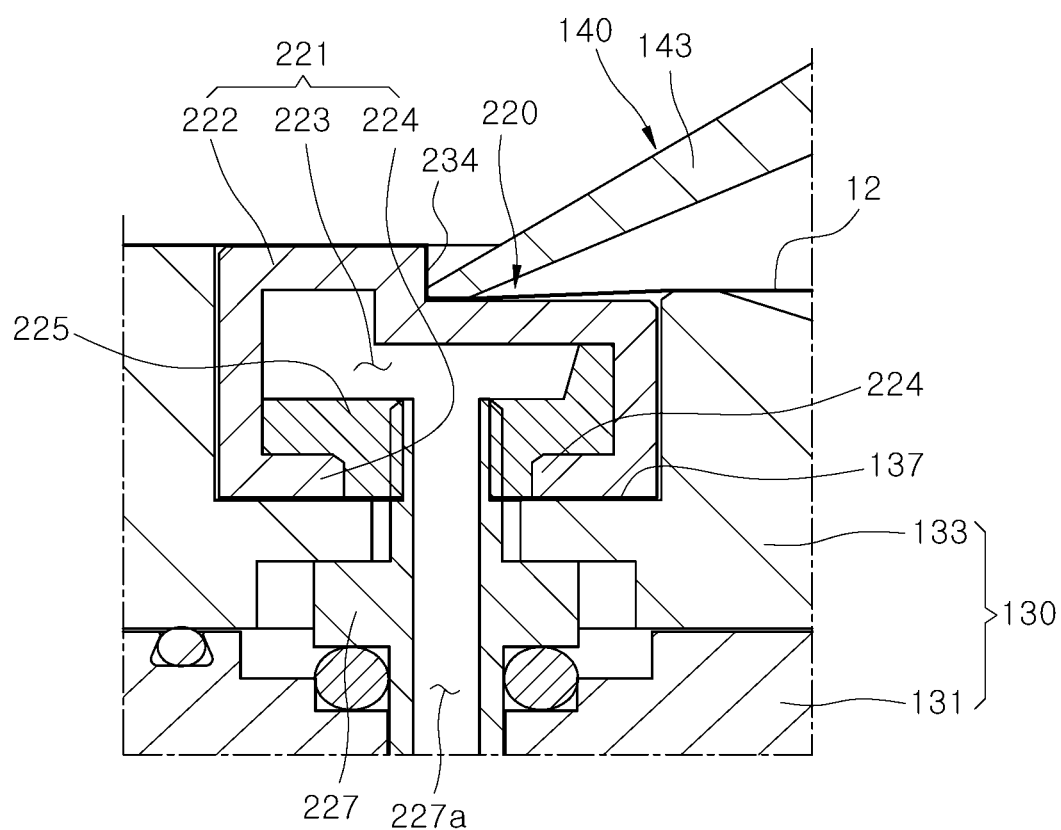

Referring to FIG. 15, a stepped portion 234 is formed at an upper end portion of a sealing body 222. The stepped portion 234 may be formed at a portion with which a distal end of a cover pressing portion 143 is in contact. The stepped portion 234 is formed in a circular shape in a circumferential direction of the sealing body 222. Since the stepped portion 234 is formed at the upper end portion of the sealing body 222, an amount of elastic deformation of the sealing body 222 is further increased, and a contact area between the sealing body 222 and the cover pressing portion 143 is increased, thereby improving the sealing performance of the sealing body 222.

Figure 16:
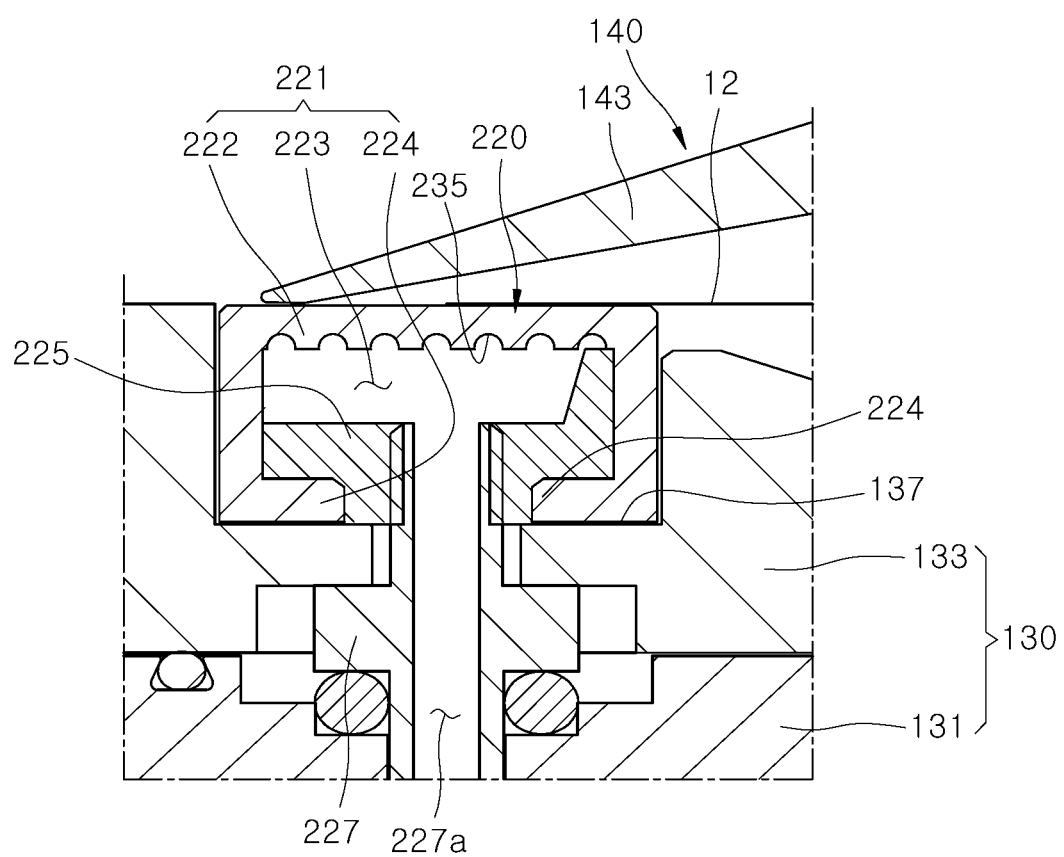
Figure 17:
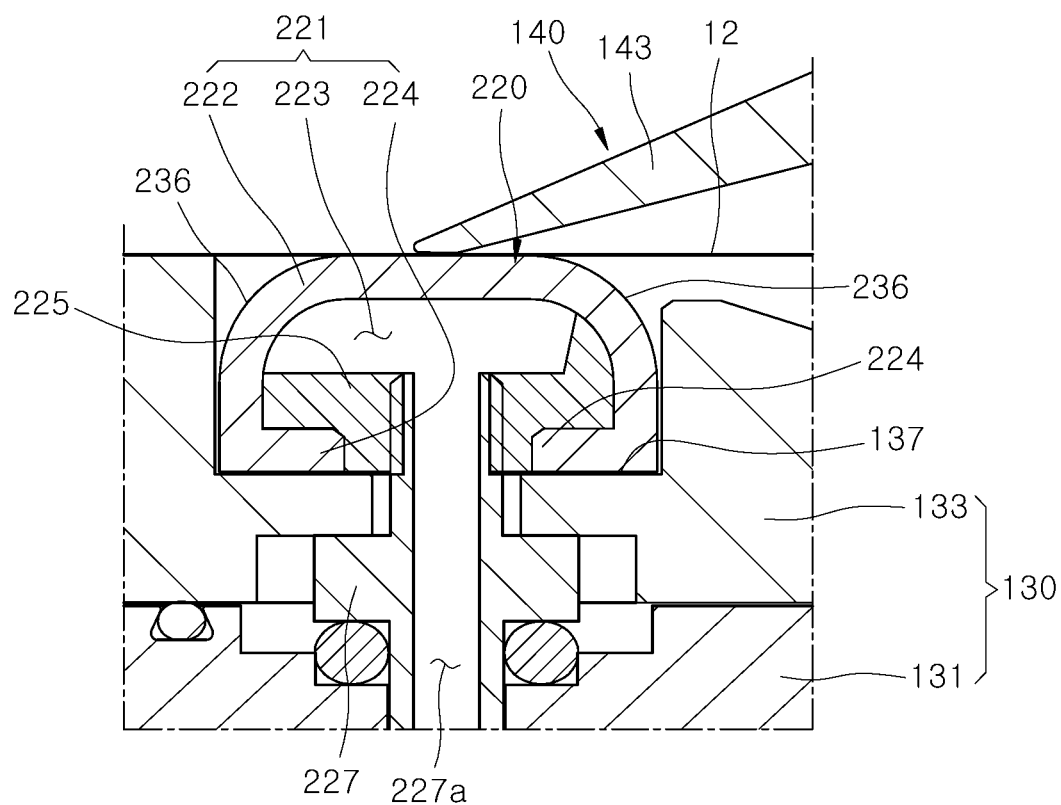

Referring to FIG. 16, a plurality of deformable grooves 235 are formed in an upper end portion of a sealing body 222. The plurality of deformable grooves 235 may be formed in an inner surface of the upper end portion of the sealing body 222. The plurality of deformable grooves 235 are formed in a circular shape in a circumferential direction of the sealing body 222. Since the plurality of deformable grooves 235 are formed at the upper end portion of the sealing body 222, an amount of elastic deformation of the sealing body 222 is further increased, and a contact area between the sealing body 222 and a cover pressing portion 143 is increased, thereby improving the sealing performance of the sealing body 222. Referring to FIG. 17, round portions 236, of which a cross section is processed to extend in a curved shape, are formed on an inner circumferential side and an outer circumferential side of an upper end portion of a sealing body 222. The round portions 236 are formed at edges of the inner circumferential side and the outer circumferential side of the upper end portion of the sealing body 222. The round portions 236 are formed in circular shapes in a circumferential direction of the sealing body 222. Since the round portions 236 are formed on the inner circumferential side and the outer circumferential side of the sealing body 222, an amount of elastic deformation of the sealing body 222 is further increased, and a contact area between the sealing body 222 and a cover pressing portion 143 is increased, thereby improving the sealing performance of the sealing body 222.

Figure 18:
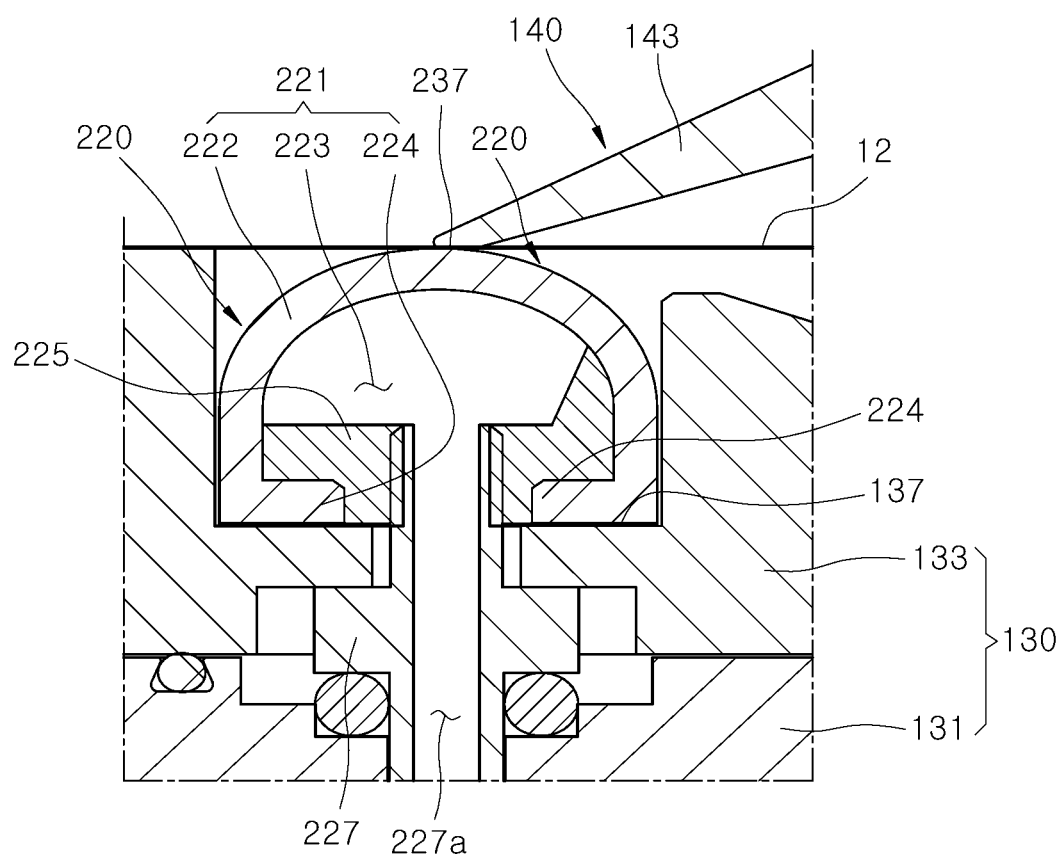

Referring to FIG. 18, a sealing body 222 includes a convex portion 237 which convexly protrudes upward from an upper portion thereof. The convex portion 237 is formed in a circular shape in a circumferential direction of the sealing body 222, and a cross-sectional shape of the convex portion 237 extends in a curved shape. Since the convex portion 237 is formed on the upper portion of the sealing body 222, an amount of elastic deformation of the sealing body 222 is further increased, and a contact area between the sealing body 222 and a cover pressing portion 143 is increased, thereby improving the sealing performance of the sealing body 222.

Figure 19:
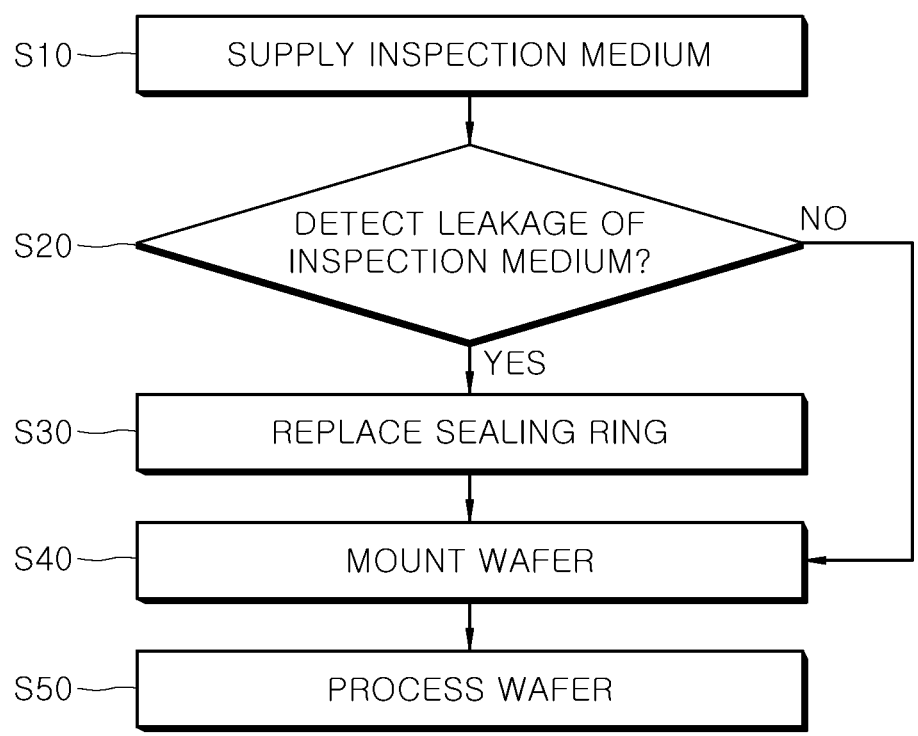
FIG. 19 is a schematic flowchart illustrating a method of controlling a wafer processing apparatus according to one embodiment of the present invention.

Hereinafter, a method of controlling the wafer processing apparatus described with reference to FIGS. 4 to 7 will be described in detail. FIG. 19 is a schematic flowchart illustrating a method of controlling a wafer processing apparatus according to one embodiment of the present invention. Referring to FIGS. 4 to 7 and 19 together, the method of controlling a wafer processing apparatus according to one embodiment of the present invention includes operation S10 of supplying an inspection medium, operation S20 of detecting leakage of the inspection medium, operation S30 of replacing a sealing ring, operation S40 of mounting a wafer, and operation S50 of processing the wafer. The method of controlling a wafer processing apparatus of the present invention may be performed before a process of processing a wafer 10 using a wafer processing apparatus is started or performed after a process of processing and unloading one wafer 10 and before a process of loading a new wafer 10 in the wafer processing apparatus.

Operation S10 of supplying the inspection medium is an operation of driving a medium supply unit 210 to supply the inspection medium into a sealing ring 220. When a valve 213 is opened, the inspection medium is supplied to a horizontal medium flow path 136 through a medium supply pipe 211. The inspection medium introduced into the horizontal medium flow path 136 is supplied into a deformable space 223 of a sealing member 221 through a connector portion 227.

When the medium supply unit 210 is driven to supply the inspection medium to the sealing ring 220, a pressure detection unit 214 and a flow rate detection unit 215 measure pressure and a flow rate of the inspection medium supplied to the sealing ring 220. Since the flow rate detection unit 215 measures the flow rate of the inspection medium such that a certain amount of the inspection medium may be supplied to the sealing ring 220, internal pressure of the sealing ring 220 can be prevented from excessively increasing. In other words, when a measured value of the flow rate detection unit 215 reaches a preset reference flow rate, a control unit (not shown) of the wafer processing apparatus may close the valve 213 or adjust an opening degree of the valve 213 to be small.

Operation S20 of detecting the leakage of the inspection medium may be an operation of detecting whether the inspection medium supplied into the sealing ring 220, that is, the deformable space 223, leaks to the outside of the sealing ring 220. When the sealing ring 220 is damaged, the inspection medium leaks through the damaged portion of the sealing ring 220. Whether the sealing ring 220 is damaged may be determined through a flow of gas felt on fingertip skin when an operator brings his/her fingertip close to the sealing ring 220. When the inspection medium includes a fluorescent material, since a fluorescent color identifiably appears on the outside of the sealing ring 220, the operator may easily determine whether the sealing ring 220 is damaged even in a dark place by looking at the fluorescent material leaked to the outside of the sealing ring 22. In addition, the operator may determine whether the sealing ring 220 is damaged by using a separate leakage inspection device.

When the inspection medium is supplied from the medium supply pipe 211 to the horizontal medium flow path 136 and the pressure of the medium supply pipe 211 measured by the pressure detection unit 214 is lower than preset reference pressure, the control unit (not shown) of the wafer processing apparatus may determine that the sealing ring 220 is damaged.

Operation S30 of replacing the sealing ring is an operation of, when the leakage of the inspection medium is detected and it is determined that the sealing ring 220 is damaged in operation S20 of detecting the leakage of the inspection medium, removing the sealing ring 220 from a sealing groove 137 of a vacuum chuck unit 130 and installing a new sealing ring 220 in the sealing groove 137. In operation S30 of replacing the sealing ring, a fluid medium inside the new sealing ring 220 may be discharged. For this reason, a sealing body 222 is contracted while being compressed inside the sealing groove 137, and a fixing rib 224 of the sealing ring 220 is deformed and tightly fitted into a restraining ring portion 225.

Accordingly, the assembly precision of the sealing ring 220 can be improved.

Operation S40 of mounting the wafer is an operation of fixing and mounting a wafer assembly 15 on the vacuum chuck unit 130 of the wafer processing apparatus. First, operation S40 of mounting the wafer includes an operation in which a wafer transfer unit (not shown) picks up the wafer assembly 15, on which a wafer processing process such as an etching or cleaning process is not performed, and places the wafer assembly 15 on the vacuum chuck unit 130. A retainer ring portion 13 of the wafer assembly 15 is mounted on an outer peripheral portion of the vacuum chuck unit 130, and an adhesive sheet 12 between the retainer ring portion 13 and the wafer 10 is mounted on an upper side of the sealing ring 220.

Next, operation S40 of mounting the wafer includes an operation of driving a chucking module 150 to fix the wafer assembly 15 to the vacuum chuck unit 130. In this case, a chucking base 151 is rotated by a chucking rotating part 155 to simultaneously move a plurality of first chucking link parts 160 and a plurality of second chucking link parts 180. As the first chucking link parts 160 move, the retainer ring portion 13 of the wafer assembly 15 is fixed to the vacuum chuck unit 130, and as the second chucking link parts 180 move, a restraining stepped portion 142 of a ring cover unit 140 connected thereto moves downward and is fixed. Thus, a cover pressing portion 143 presses the sealing ring 220 with the adhesive sheet 12 interposed therebetween.

Next, operation S40 of mounting the wafer includes an operation of supplying, for example, a fluid medium such as air into the sealing ring 220 to expand the sealing ring 220. The fluid medium is supplied into the sealing ring 220 through a vertical medium flow path 117 and the horizontal medium flow path 136. Due to an expansive force of the sealing ring 220, the sealing ring 220 is more strongly pressed against the cover pressing portion 143 of the ring cover unit 140, thereby further improving the sealing performance of the ring cover unit 140.

Operation S50 of processing the wafer is an operation of spraying a processing solution onto the wafer 10 of the wafer assembly 15 to process the wafer 10. In this case, a processing solution spraying nozzle (not shown) sprays the processing solution above the wafer 10. When the processing of the wafer 10 is completed, the chucking module 150 is driven to release the restraint of the wafer 10, and the wafer transfer unit picks up the wafer assembly 15 to discharge the wafer assembly 15 to the outside of the vacuum chuck unit 130.

When the leakage of the inspection medium is not detected in operation S20 of detecting the leakage of the inspection medium, operation S30 of replacing the sealing ring may be omitted. In other words, after operation S20 of detecting the leakage of the inspection medium, operation S40 of mounting the wafer and operation S50 of processing the wafer may be performed without replacing the sealing ring 220.

Figure 20:
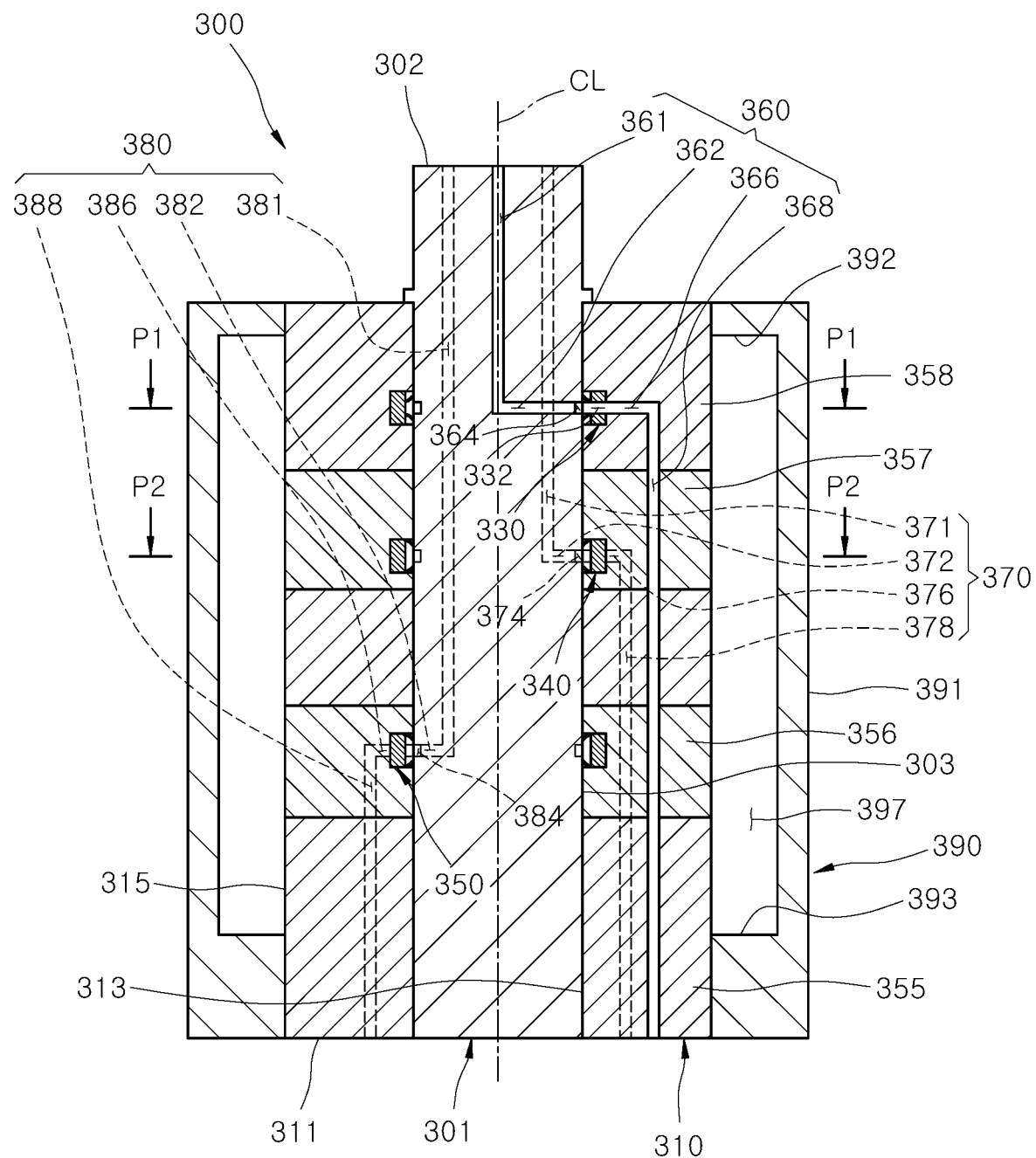
FIG. 20 is a longitudinal sectional view of a rotary joint connected to a lower end of a rotating shaft of FIG. 4 according to one embodiment.
Figure 21:
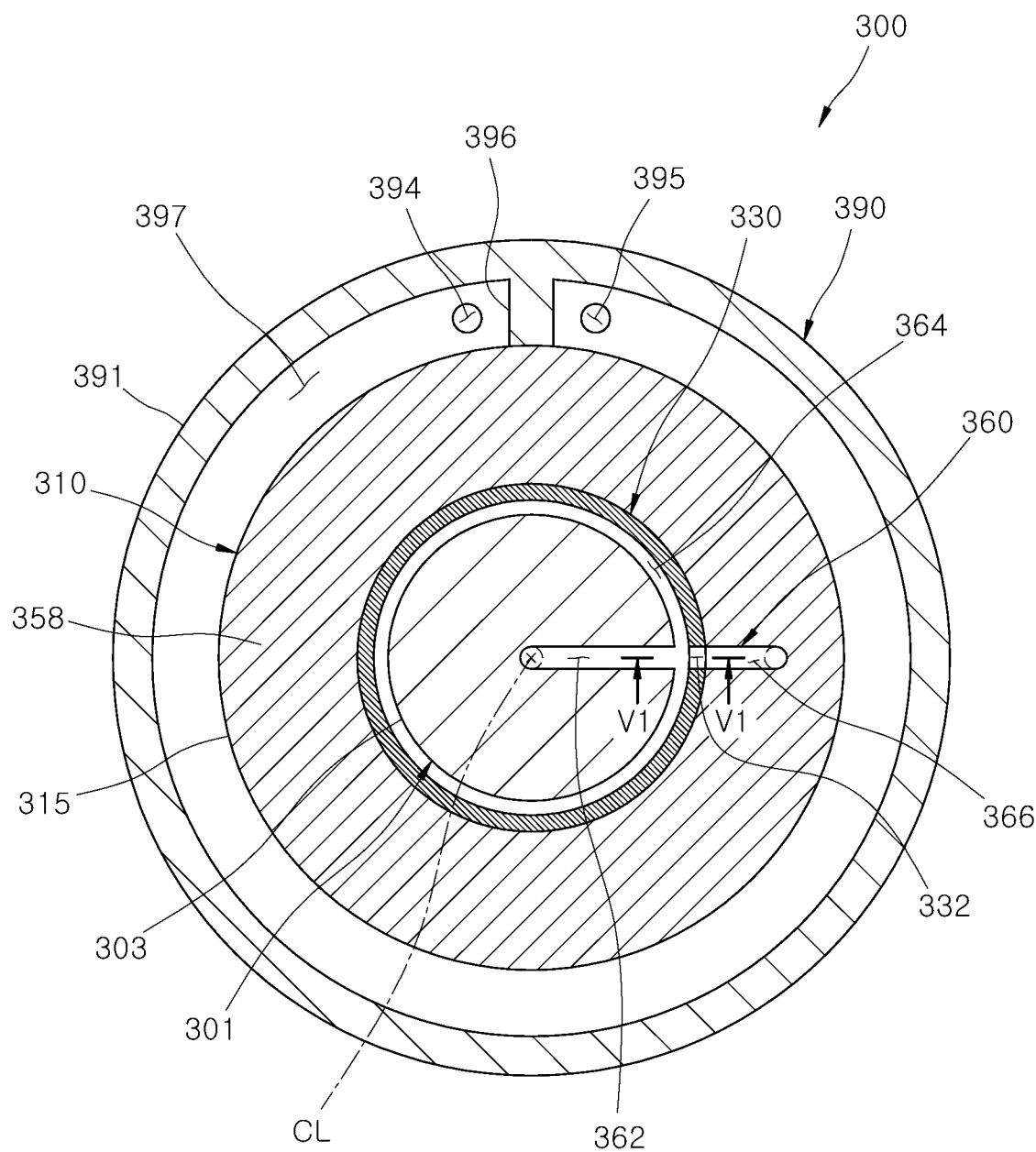
FIG. 21 is a cross-sectional view taken along line P1-P1 which illustrates the rotary joint of FIG. 20.
Figure 22:
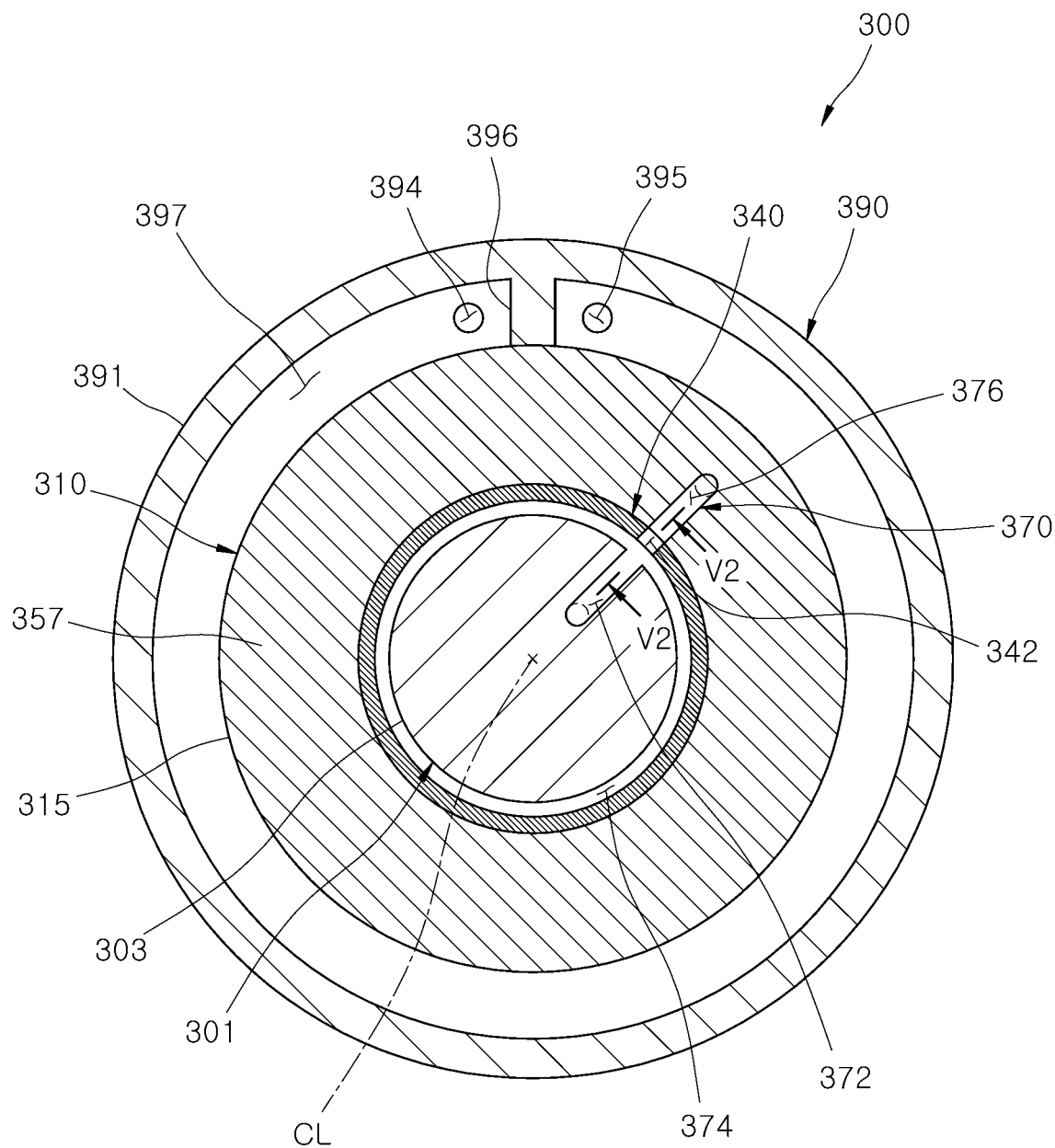
FIG. 22 is a cross-sectional view taken along line P2-P2 which illustrates the rotary joint of FIG. 20.
Figure 23:
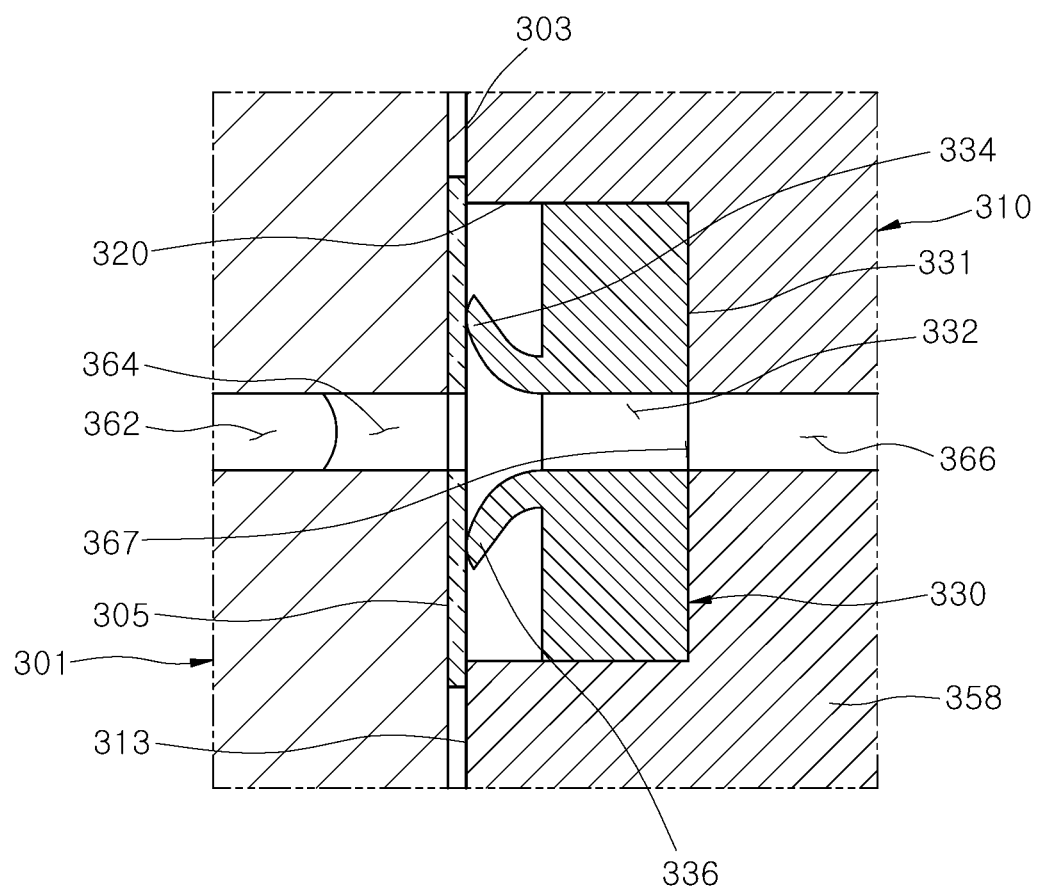
FIG. 23 is a longitudinal cross-sectional view taken along line V1-V1 of FIG. 21.
Figure 24:
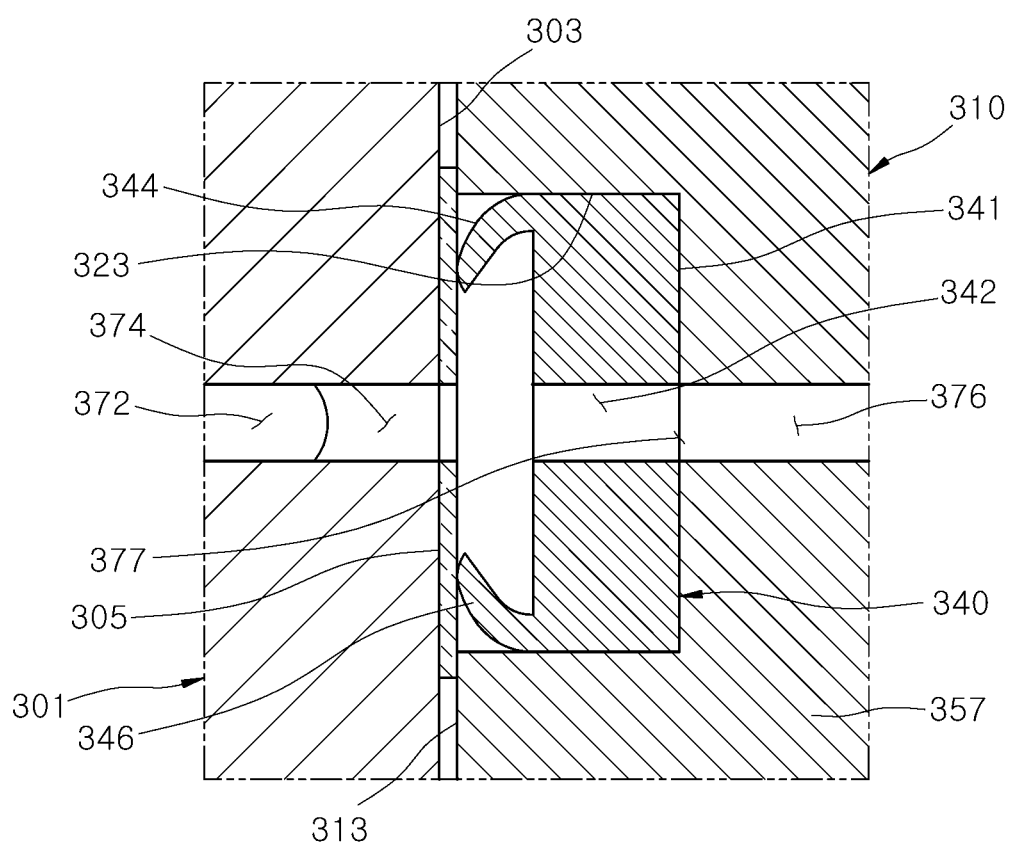
FIG. 24 is a longitudinal cross-sectional view taken along line V2-V2 of FIG. 22.

FIG. 20 is a longitudinal sectional view of a rotary joint connected to a lower end of the rotating shaft of FIG. 4 according to one embodiment. FIG. 21 is a cross-sectional view taken along line P1-P1 which illustrates the rotary joint of FIG. 20. FIG. 22 is a cross-sectional view taken along line P2-P2 which illustrates the rotary joint of FIG. 20. FIG. 23 is a longitudinal cross-sectional view taken along line V1-V1 of FIG. 21. FIG. 24 is a longitudinal cross-sectional view taken along line V2-V2 of FIG. 22. Referring to FIGS. 4 and 20 to 24 together, the wafer processing apparatus of the present invention may further include a rotary joint 300 connected to the lower end of the rotating shaft 111 shown in FIG. 4. The rotary joint 300 includes a rotating core 301, a fixed core 310, and a cooling case 390.

A vacuum connection flow path 360 fluidly connected to a lower end of the vacuum flow path 115 of the rotating shaft 111 and first and second press connection flow paths 370 and 380 fluidly connected to lower ends of the vertical medium flow paths 117 are formed inside the rotating core 301 and the fixed core 310. As shown in FIG. 4, since one pair of vertical medium flow paths 117 are formed, one pair of press connection flow paths 370 and 380 are formed to correspond to the one pair of vertical medium flow paths 117. Unlike that shown in FIG. 4, when the number of vertical medium flow paths is one or three or more, the number of the press connection flow paths is the same as the number of the vertical medium flow paths.

The rotating core 301 is connected to the lower end of the rotating shaft 111 to rotate together with the rotating shaft 111 about the axis CL. The fixed core 310 surrounds the rotating core 301 and rotatably supports the rotating core 301. The fixed core 310 does not rotate together with the rotating core 301. The rotating core 301 has an approximately cylindrical shape, and the fixed core 310 has an approximately hollow cylindrical shape.

The vacuum connection flow path 360 includes a first vertical vacuum flow path 361, a first horizontal vacuum flow path 362, a second vertical vacuum flow path 368, and a second horizontal vacuum flow path 366. The first horizontal vacuum flow path 362 extends in a vertical direction parallel to the axis CL inside the rotating core 301, and an upper end thereof is open toward an upper surface 302 of the rotating core 301 to be fluidly connected to the lower end of the vacuum flow path 115. The first horizontal vacuum flow path 362 is fluidly connected to a lower end of the first vertical vacuum flow path 361 and extends in a horizontal direction toward an outer circumferential surface 303 of the rotating core 301.

The second vertical vacuum flow path 368 extends in the vertical direction parallel to the axis CL inside the fixed core 310 and has a lower end that is open toward a lower surface 311 of the fixed core 310. A lower end of the second vertical vacuum flow path 368 is fluidly connected to a vacuum suction unit (not shown) which suctions a fluid such that the fluid flows through an upper end of the first vertical vacuum flow path 361 to be discharged through the lower end of the second vertical vacuum flow path 368. The vacuum suction unit may include a vacuum pump (not shown) which forms negative pressure.

The second horizontal vacuum flow path 366 is fluidly connected to an upper end of the second vertical vacuum flow path 368 and extends in the horizontal direction toward an inner circumferential surface 313 of the fixed core 310 to be fluidly connected to the first horizontal vacuum flow path 362. The first horizontal vacuum flow path 362 includes an annular groove 364 that is recessed inward from the outer circumferential surface 303 of the rotating core 301. The annular groove 364 extends along a circular orbit centered on the axis CL. Since the annular groove 364 is formed, even when the rotating core 301 rotates with respect to the fixed core 310, a fluid may flow from the first horizontal vacuum flow path 362 to the second horizontal vacuum flow path 366.

The first and second press connection flow paths 370 and 380 include first vertical press flow paths 371 and 381, first horizontal press flow paths 372 and 382, second vertical press flow paths 378 and 388, and second horizontal press flow paths 376 and 386, respectively. The first vertical press flow paths 371 and 381 extend in the vertical direction parallel to the axis CL inside the rotating core 301, and upper ends thereof are open toward the upper surface 302 of the rotating core 301 to be fluidly connected to the lower ends of the one pair of vertical medium flow paths 117. The first horizontal press flow paths 372 and 382 are fluidly connected to lower ends of the first vertical press flow paths 371 and 381 and extend in the horizontal direction toward the outer circumferential surface 303 of the rotating core 301.

The second vertical press flow paths 378 and 388 extend in the vertical direction parallel to the axis CL inside the fixed core 310 and have lower ends that are open toward the lower surface 311 of the fixed core 310. Lower ends of the second vertical press flow paths 378 and 388 are fluidly connected a fluid flow medium supply unit (not shown) which supplies a fluid medium such that the fluid medium flows through the lower ends of the second vertical press flow paths 378 and 388 to be discharged through the upper ends of the first vertical press flow paths 371 and 381. The fluid medium supply unit may include a positive pressure pump which forms positive pressure.

The second horizontal press flow paths 376 and 386 are fluidly connected to upper ends of the second vertical press flow paths 378 and 388 and extend in the horizontal direction toward the inner circumferential surface 313 of the fixed core 310 to be connected to the first horizontal press flow paths 372 and 382. The first horizontal press flow paths 372 and 382 include annular grooves 374 and 384 which are recessed inward from the outer circumferential surface 303 of the rotating core 301. The annular grooves 374 and 384 extend along a circular orbit centered on the axis CL. The annular groove 384 of the second press connection flow path 380 and the annular groove 374 of the first press connection flow path 370 are formed only at different levels in the outer circumferential surface of the rotating core 301 but have the same shape. Since the annular grooves 374 and 384 are formed, even when the rotating core 301 rotates with respect to the fixed core 310, a fluid may flow from the second horizontal press flow paths 376 and 386 to the first horizontal press flow paths 372 and 382.

The vacuum connection flow path 360 and the first and second press connection flow paths 370 and 380 do not intersect each other inside the rotating core 301 and the fixed core 310. Due to such a configuration, a fluid flowing from the vacuum flow path 115 to the vacuum connection flow path 360 is discharged to the outside of the rotary joint 300 through the lower surface 311 of the fixed core 310. In addition, a fluid flowing from the first and second press connection flow paths 370 and 380 to the vertical medium flow paths 117, that is, a fluid medium, flows into the rotary joint 300 through the lower surface 311 of the fixed core 310.

The rotary joint 300 further includes a vacuum flow path packing 330 with an annular shape which is installed on the inner circumferential surface 313 of the fixed core 310 such that vacuum pressure of the vacuum connection flow path 360, negative pressure, is prevented from being weakened due to a fluid flowing into the vacuum connection flow path 360 between the first horizontal vacuum flow path 362 and the second horizontal vacuum flow path 366 and first and second press flow path packings 340 and 350 with an annular shape which are installed on the inner circumferential surface 313 of the fixed core 310 such that pneumatic pressure of the first and second press connection flow paths 370 and 380 is prevented from being weakened due to a fluid leaking outward from the first and second press connection flow paths 370 and 380 between the first horizontal press flow paths 372 and 382 and the second horizontal press flow paths 376 and 386 of the first and second press connection flow paths 370 and 380.

A vacuum flow path packing seating groove 320, a first press flow path packing seating groove 323, and a second press flow path packing seating groove (not shown), which are recessed to extend in an annular shape along a circular orbit centered on the axis CL, are formed in the inner circumferential surface 313 of the fixed core 310. The vacuum flow path packing seating groove 320 is formed at the same level as the first horizontal vacuum flow path 362 and the second horizontal vacuum flow path 366. The first press flow path packing seating groove 323 is formed at the same level as the first horizontal press flow path 372 and the second horizontal press flow path 376 of the first press connection flow path 370. The second press flow path packing seating groove is formed at the same level as the first horizontal press flow path 382 and the second horizontal press flow path 386 of the second press connection flow path 380.

The vacuum flow path packing 330 includes a body portion 331, an upper lip portion 334, and a lower lip portion 336. The body portion 331, the upper lip portion 334, and the lower lip portion 336 all extend in an annular shape along a circular orbit centered on the axis CL. The upper lip portion 334 and the lower lip portion 336 are disposed to be vertically spaced apart from each other. The body portion 331 is inserted and seated in the vacuum flow path packing seating groove 320. A through-hole 332 passing through the body portion 331 in the horizontal direction is formed in the body portion 331 such that the second horizontal vacuum flow path 366 is not closed. The upper lip portion 334 and the lower lip portion 336 protrude from the body portion 331 toward the outer circumferential surface 303 of the rotating core 301 to be in contact with the outer circumferential surface 303 of the rotating core 301 without closing the first horizontal vacuum flow path 362.

As shown in FIG. 23, in a direction toward the outer circumferential surface 303 of the rotating core 301 in the horizontal direction, the upper lip portion 334 and the lower lip portion 336 protrude in the vertical direction to be inclined in a direction away from the annular groove 364 of the first horizontal vacuum flow path 362. Specifically, in the direction toward the outer circumferential surface 303 of the rotating core 301 in the horizontal direction, the upper lip portion 334 protrudes to be inclined upward, and in the direction toward the outer circumferential surface 303 of the rotating core 301 in the horizontal direction, the lower lip portion 336 protrudes to be inclined downward. When vacuum pressure is formed such that a fluid is suctioned between the annular groove 364 of the first horizontal vacuum flow path 362 and an end 367 of an inner circumferential side of the second horizontal vacuum flow path 366, since an end of the upper lip portion 334 and an end of the lower lip portion 336 approach each other to decrease a gap therebetween and thus are tightly pressed against the outer circumferential surface 303 of the rotating core 301, an inflow of the fluid between the outer circumferential surface 303 of the rotating core 301 and the ends of the upper lip portion 334 and the lower lip portion 336 is reliably blocked so that vacuum pressure of the vacuum connection flow path 360 is not lowered.

The first press flow path packing 340 includes a body portion 341, an upper lip portion 344, and a lower lip portion 346. The body portion 341, the upper lip portion 344, and the lower lip portion 346 all extend in an annular shape along a circular orbit centered on the axis CL. The upper lip portion 344 and the lower lip portion 346 are disposed to be vertically spaced apart from each other. The body portion 341 is inserted and seated in the first press flow path packing seating groove 323. A through-hole 342 passing through the body portion 341 in the horizontal direction is formed in the body portion 341 such that the second horizontal press flow path 376 is not closed. The upper lip portion 344 and the lower lip portion 346 protrude from the body portion 341 toward the outer circumferential surface 303 of the rotating core 301 to be in contact with the outer circumferential surface 303 of the rotating core 301 without closing the first horizontal press flow path 372.

As shown in FIG. 24, in a direction toward the outer circumferential surface 303 of the rotating core 301 in the horizontal direction, the upper lip portion 344 and the lower lip portion 346 protrude in the vertical direction to be inclined in a direction toward the annular groove 374 of the first horizontal press flow path 372. Specifically, in the direction toward the outer circumferential surface 303 of the rotating core 301 in the horizontal direction, the upper lip portion 334 protrudes to be inclined downward, and in the direction toward the outer circumferential surface 303 of the rotating core 301 in the horizontal direction, the lower lip portion 346 protrudes to be inclined upward. When positive pressure is formed such that a fluid is supplied between the annular groove 374 of the first horizontal press flow path 372 and an end 377 of an inner circumferential side of the second horizontal press flow path 376, since an end of the upper lip portion 344 and an end of the lower lip portion 346 move away from each other to increase a gap therebetween and thus are tightly pressed against the outer circumferential surface 303 of the rotating core 301, an outflow of a fluid between the outer circumferential surface 303 of the rotating core 301 and the ends of the upper lip portion 344 and the lower lip portion 346 is reliably blocked so that positive pressure of the first press connection flow path 370 is not lowered.

Since the second press flow path packing 350 includes a body portion, an upper lip portion, and a lower lip portion which have the same shapes and structures as the body portion 341, the upper lip portion 344, and the lower lip portion 346 of the first press flow path packing 340, redundant descriptions thereof are omitted. The body portion of the second press flow path packing 350 is inserted and seated in the second press flow path packing seating groove (not shown). The vacuum flow path packing 330, the first press flow path packing 340, and the second press flow path packing 350 may be made of, for example, rubber. Preferably, in order to reduce friction with the rotating core 301 that rotates, the vacuum flow path packing 330, the first press flow path packing 340, and the second press flow path packing 350 may be made of polytetrafluoroethylene (PTFE) having excellent self-lubricity.

The rotating core 301 includes a ceramic coating layer 305 stacked on the outer circumferential surface 303 so as to reduce friction when the rotating core 301 rotates about the axis CL with respect to the fixed core 310. The ceramic coating layer 305 has excellent thermal resistance and abrasion resistance to allow the rotating core 301 to stably rotate at a high speed and to suppress damage to the rotating core 301 and the fixed core 310. As shown in FIGS. 23 and 24, the ceramic coating layer 305 may be selectively stacked only on an area of the outer circumferential surface 303 in contact with the vacuum flow path packing 330, the first press flow path packing 340, and the second press flow path packing 350 and may also be stacked on an entire area of the outer circumferential surface 303.

The fixed core 310 may include one member, but as shown in FIG. 20, the fixed core 310 may include a plurality of annular blocks 355, 356, 357, and 358 which are stacked to surround the rotating core 301. In this case, a height of the rotary joint 300 may be easily changed by adding or subtracting the number of the plurality of annular blocks 355, 356, 357, and 358. In addition, when the plurality of standardized annular blocks 355, 356, 357, and 358 are provided in advance, the rotary joint 300 may be quickly assembled and manufactured. The cooling case 390 surrounds an outer circumferential surface of the fixed core 310 such that a cooling flow path 397 is formed between the cooling case 390 and the fixed core 310. Specifically, the cooling case 390 includes an annular upper end portion 392 and a lower end portion 393 which are coupled to and supported on upper end and lower end portions of the outer circumferential surface of the fixed core 310. A pipe portion 391 is provided to extend from an outer peripheral portion of the upper end portion 392 to an outer peripheral portion of the lower end portion 393 so that the cooling flow path 397 is formed between the outer circumferential surface of the fixed core 310, an inner circumferential surface of the pipe portion 391, a lower surface of the upper end portion 392, and an upper surface of the lower end portion 393.

A refrigerant inlet hole 394 and a refrigerant outlet hole 395 are formed in the lower end portion 393 to vertically pass through the lower end portion 393. The pipe portion 391 has an inner wall 396 protruding from an inner circumferential surface thereof toward the axis CL to be in contact with the outer circumferential surface of the fixed core 310. The refrigerant inlet hole 394 and the refrigerant outlet hole 395 are formed at one side and the other side with the inner wall 396 therebetween. The refrigerant inlet hole 394 is connected to a refrigerant supply flow path (not shown) outside the rotary joint 300, and the refrigerant outlet hole 395 is connected to a refrigerant discharge flow path (not shown) outside the rotary joint 300.

Even when the rotating core 301 rotates at a high speed with respect to the fixed core 310, a refrigerant flowing into the cooling flow path 397 through the refrigerant inlet hole 394 flows along the outer circumferential surface of the fixed core 310 to cool the fixed core 310 and the rotating core 301 through heat exchange and is discharged to the outside of the rotary joint 300 through the refrigerant outlet hole 395. Accordingly, overheating of the rotary joint 300 and damage due to the overheating are prevented, and a service life of the rotary joint 300, that is, durability thereof, is improved.

When the fixed core 310 includes the plurality of annular blocks 355, 356, 357, and 358 stacked as shown in FIG. 20, a refrigerant flowing into the cooling flow path 397 may pass between the stacked annular blocks 355, 356, 357, and 358 so that cooling efficiency can be further improved. The inner wall 396 may be disposed between the refrigerant inlet hole 394 and the refrigerant outlet hole 395 so that a refrigerant flowing into the cooling flow path 397 through the refrigerant inlet hole 394 may not be discharged to the refrigerant outlet hole 395 without sufficient heat exchange. A refrigerant flowing into the cooling flow path 397 through the refrigerant inlet hole 394 may be, for example, cooling water at room temperature.

The rotary joint 300 is fluidly connected to the vacuum suction unit (not shown) and the fluid medium supply unit (not shown) outside the rotary joint 300 only through a lower end of the fixed core 310 and is not connected to the vacuum suction unit and the fluid medium supply unit through an outer circumferential surface of the rotary joint 300. Therefore, the rotary joint 300 can be miniaturized, designed, and manufactured and can be easily installed in a limited installation space.

Figure 25:
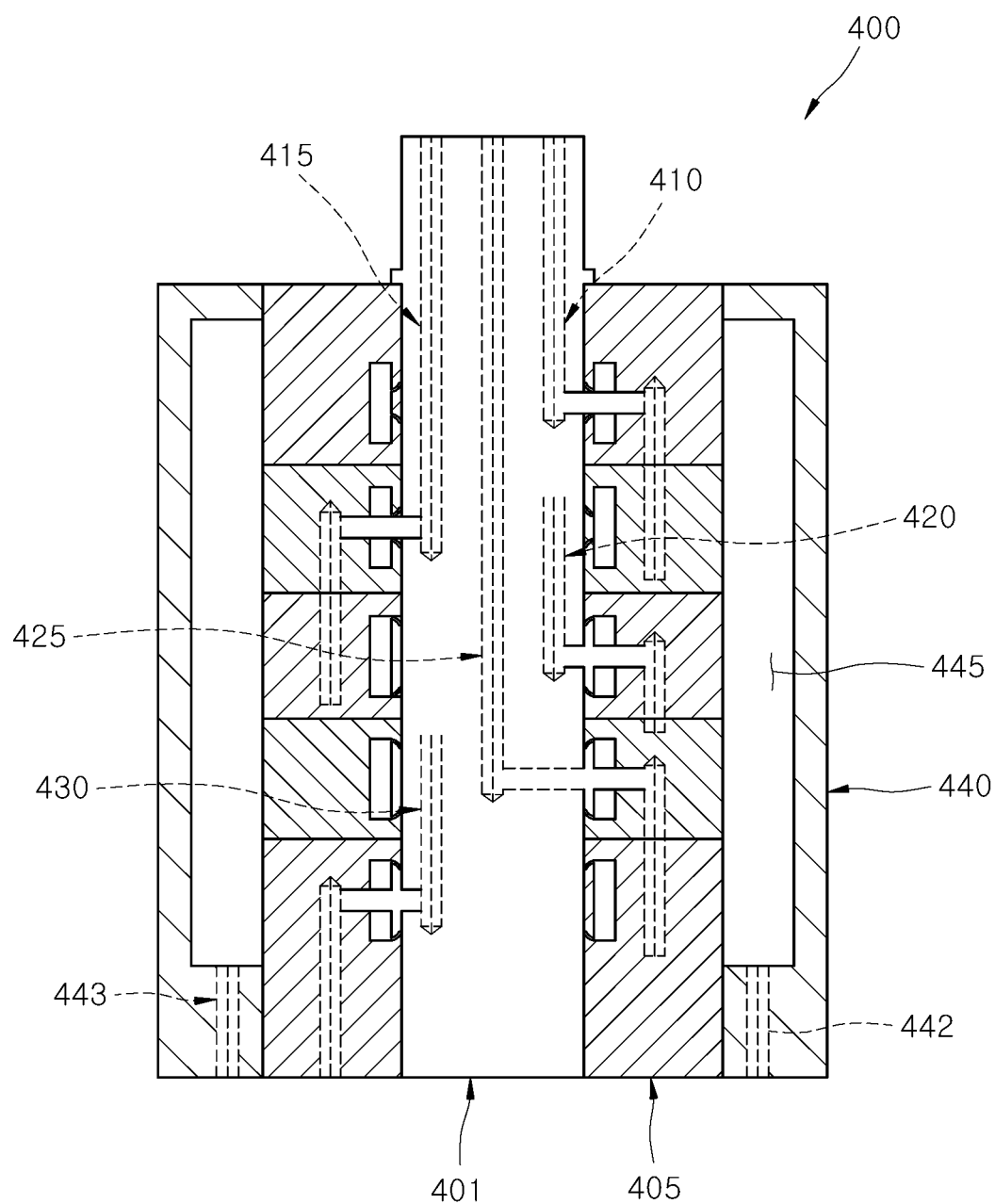
FIG. 25 is a longitudinal cross-sectional view of a rotary joint according to another embodiment.

FIG. 25 is a longitudinal cross-sectional view of a rotary joint according to another embodiment. Referring to FIG. 25, like the rotary joint 300 shown in FIG. 20, a rotary joint 400 according to another embodiment of the present invention includes a rotating core 401, a fixed core 405, and a cooling case 440. The rotating core 401 is rotatable with respect to the fixed core 405, and a cooling flow path 445, in which a refrigerant flows to prevent overheating of the rotating core 401 and the fixed core 405, is formed between an outer circumferential surface of the fixed core 405 and an inner circumferential surface of the cooling case 440. A refrigerant inlet hole 442 for guiding a refrigerant to flow into the cooling flow path 445 from the outside of the rotary joint 400 and a refrigerant outlet hole 443 for guiding a refrigerant to be discharged to the outside of the rotary joint 400 from the cooling flow path 445 are formed in a lower end portion of the cooling case 440.

Unlike the rotary joint 300 shown in FIG. 20, the rotary joint 400 includes a plurality of vacuum connection flow paths 410 and 415 and a plurality of press connection flow paths 420, 425, and 430 inside the rotating core 401 and the fixed core 405. The plurality of vacuum connection flow paths 410 and 415 do not intersect each other inside the rotary joint 400, and the plurality of press connection flow paths 420, 425, and 430 also do not intersect each other inside the rotary joint 400.

Like the vacuum connection flow path 360 of the rotary joint 300 shown in FIG. 20, each of the plurality of vacuum connection flow paths 410 and 415 includes a first vertical vacuum flow path, a second vertical vacuum flow path, a first horizontal vacuum flow path, and a second horizontal vacuum flow path. Like the press connection flow paths 370 and 380 of the rotary joint 300 shown in FIG. 20, each of the plurality of press connection flow paths 420, 425, and 430 includes a first vertical press flow path, a second vertical press flow path, a first horizontal press flow path, and a second horizontal press flow path.

Like the rotary joint 300 of FIG. 20, lower ends of all the second vertical vacuum flow paths of the plurality of vacuum connection flow paths 410 and 415 are open downward through a lower surface of the fixed core 405, and upper ends of all the first vertical vacuum flow paths of the vacuum connection flow paths 410 and 415 are open upward through an upper surface of the rotating core 401. In addition, like the rotary joint 300 of FIG. 20, lower ends of all the second vertical press flow paths of the plurality of press connection flow paths 420, 425, and 430 are open downward through the lower surface of the fixed core 405, and upper ends of all the first vertical press flow paths of the plurality of press connection flow paths 420, 425, and 430 are open upward through the upper surface of the rotating core 401.

At least one of the plurality of press connection flow paths 420, 425, and 430 is connected to a medium supply unit 210. Accordingly, an inspection medium for identifying damage to a sealing ring 220 may pass through a medium supply pipe 211 of the medium supply unit 210, may flow into the rotary joint 400 through the lower surface of the fixed core 405 to be discharged through the upper surface of the rotating core 401, and may be supplied to the sealing ring 220 through a vertical medium flow path 117 and a horizontal medium flow path 136.

However, although, in FIG. 25, the lower ends of the second vertical vacuum flow paths of the plurality of vacuum connection flow paths 410 and 415 are illustrated as not extending downward to be open through the lower surface of the fixed core 405, this is because the lower ends of the second vertical vacuum flow paths are schematically shown due to a limitation in that the entireties thereof cannot be shown on one longitudinal cross section. Although, in FIG. 25, the upper ends of the first vertical press flow paths of the plurality of press connection flow paths 420, 425, and 430 are illustrated as not extending upward to be open through the upper surface of the rotating core 401 and the lower ends of the second vertical press flow paths of the plurality of press connection flow paths 420, 425, and 430 are illustrated as not extending downward to be open through the lower surface of the fixed core 405, this is also because the upper ends of the first vertical press flow paths and the lower ends of the second vertical press flow paths are schematically shown due to a limitation in that the entireties thereof cannot be shown on one longitudinal cross section.

Figure 26:
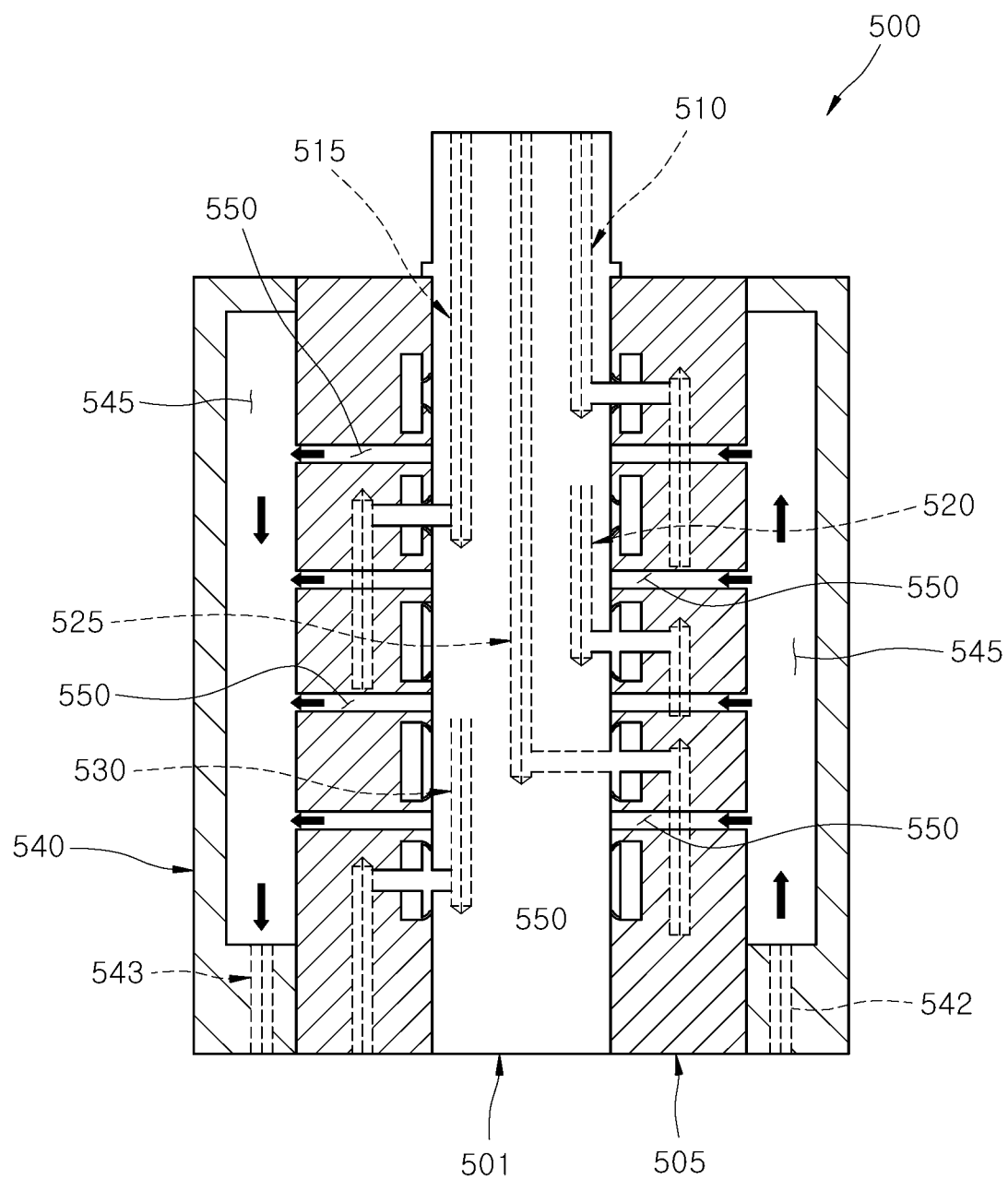
FIG. 26 is a longitudinal cross-sectional view of a rotary joint according to still another embodiment.

FIG. 26 is a longitudinal cross-sectional view of a rotary joint according to still another embodiment. Referring to FIG. 26, like the rotary joint 400 shown in FIG. 25, a rotary joint 500 according to still another embodiment of the present invention includes a rotating core 501, a fixed core 505, and a cooling case 540. The rotating core 501 is rotatable with respect to the fixed core 505, and a cooling flow path 545, in which a refrigerant flows to prevent overheating of the rotating core 501 and the fixed core 505, is formed between an outer circumferential surface of the fixed core 505 and an inner circumferential surface of the cooling case 540. A refrigerant inlet hole 542 for guiding a refrigerant to flow into the cooling flow path 545 from the outside of the rotary joint 500 and a refrigerant outlet hole 543 for guiding a refrigerant to be discharged to the outside of the rotary joint 500 from the cooling flow path 545 are formed in a lower end portion of the cooling case 540.

The rotary joint 500 includes a plurality of vacuum connection flow paths 510 and 515 and a plurality of press connection flow paths 520, 525, and 530 inside the rotating core 501 and the fixed core 505. The plurality of vacuum connection flow paths 510 and 515 do not intersect each other inside the rotary joint 500, and the plurality of press connection flow paths 520, 525, and 530 also do not intersect each other inside the rotary joint 500. The configurations of the plurality of vacuum connection flow paths 510 and 515 and the plurality of press connection flow paths 520, 525, and 530 are the same as the configurations of the plurality of vacuum connection flow paths 410 and 415 and the plurality of press connection flow paths 420, 425, and 430 shown in FIG. 25, redundant descriptions thereof are omitted.

The fixed core 505 includes one tubular block instead of a plurality of stacked blocks. A refrigerant circulation flow path 550, which is connected to the cooling flow path 545 and passes through the fixed core 50 such that a refrigerant may flow, is formed inside the fixed core 505. While a refrigerant flowing into the cooling flow path 545 through the refrigerant inlet hole 542 passes through the refrigerant circulation flow path 550, the refrigerant passes through the fixed core 505 and is discharged to the outside of the rotary joint 500 through the refrigerant outlet hole 543. Accordingly, the heat exchange efficiency of the refrigerant is improved. Therefore, even when, for example, a liquid having excellent cooling performance, such as cooling water, is not used as a refrigerant and a gas such as air or nitrogen gas (N2) is used as a refrigerant, an appropriate cooling effect for the rotary joint 500 can be expected.

According to the present invention, an operator can quickly and accurately determine whether a sealing ring is damaged through a method of supplying an inspection medium into the sealing ring through a medium supply unit and identifying whether the inspection medium leaks from the sealing ring.

Accordingly, during a process of processing a wafer using the wafer processing apparatus, it is possible to prevent the wafer processing apparatus from being contaminated and damaged due to diffusion and penetration of a processing solution into a vacuum chuck unit and a rotary chuck unit and it is possible to reduce maintenance costs of the wafer processing apparatus.

According to the present invention, it is possible to design and manufacture a rotary joint which includes a plurality of vacuum connection flow paths and a plurality of press connection flow paths and is also miniaturized so that the rotary joint and a wafer processing apparatus having the same can be easily installed in a limited installation space.

According to the present invention, the rotary joint includes a vacuum flow path packing and a press flow path packing which are made of rubber, thereby preventing pressure loss in the vacuum connection flow path and the press connection flow path, and as compared with a case in which a mechanical seal is applied, the rotary joint is easily miniaturized, and particle generation is suppressed.

According to the present invention, since a cooling case is installed on an outer circumferential surface of a fixed core such that a refrigerant circulation flow path is formed in the rotary joint, heat generation during an operation of the rotary joint is suppressed to improve durability, that is, a service life of the rotary joint.

While the present invention has been described with reference to embodiments shown in the drawings, these should be considered in a descriptive sense only, and it will be understood by those skilled in the art that various alterations and other equivalent embodiments may be made. Accordingly, the true scope of protection of the present invention should be defined only by the appended claims.

What is claimed is:

1. A wafer processing apparatus comprising:
   a vacuum chuck unit configured to adsorb and support a wafer assembly including a wafer;
   a rotary chuck unit configured to rotate the vacuum chuck unit;
   a rotating shaft connected to the rotary chuck unit to rotate the rotary chuck unit;
   a ring cover unit configured to press the wafer assembly such that a processing solution sprayed onto the wafer is not diffused into the vacuum chuck unit;
   a sealing ring installed in the vacuum chuck unit and configured to support the wafer assembly; and
   a medium supply unit connected to the vacuum chuck unit and configured to supply an inspection medium to the vacuum chuck unit such that the inspection medium for identifying damage to the sealing ring flows into the sealing ring,
   wherein a vacuum flow path for forming vacuum pressure in the vacuum chuck unit is formed in the rotating shaft.

2. The wafer processing apparatus of claim 1, wherein a vertical medium flow path for supplying a fluid medium to the sealing ring is formed in the rotating shaft.

3. The wafer processing apparatus of claim 2, wherein the wafer processing apparatus further includes a rotary joint including a rotating core connected to the rotating shaft to rotate together with the rotating shaft and a fixed core configured to surround the rotating core and rotatably support the rotating core.

4. The wafer processing apparatus of claim 3, wherein:
one or more vacuum connection flow paths fluidly connected to the vacuum flow path and one or more press connection flow paths fluidly connected to the vertical medium flow path are formed in the rotary joint;
a fluid flowing into the one or more vacuum connection flow paths from the vacuum flow path is discharged outward from the rotary joint through the fixed core; and
a fluid flowing into the vertical medium flow path from the one or more press connection flow paths flows into the rotary joint through the fixed core.

5. The wafer processing apparatus of claim 4, wherein:
each of the one of more vacuum connection flow paths includes a first vertical vacuum flow path extending in a vertical direction inside the rotating core and having an upper end that is open toward an upper surface of the rotating core, a first horizontal vacuum flow path connected to a lower end of the first vertical vacuum flow path and extending in a horizontal direction toward an outer circumferential surface of the rotating core, a second vertical vacuum flow path extending in the vertical direction inside the fixed core and having a lower end that is open toward a lower surface of the fixed core, and a second horizontal vacuum flow path connected to an upper end of the second vertical vacuum flow path and extending in the horizontal direction toward an inner circumferential surface of the fixed core to be connected to the first horizontal vacuum flow path;
each of the one or more press connection flow paths includes a first vertical press flow path extending in the vertical direction inside the rotating core and having an upper end that is open toward the upper surface of the rotating core, a first horizontal press flow path connected to a lower end of the first vertical press flow path and extending in the horizontal direction toward the outer circumferential surface of the rotating core, a second vertical press flow path extending in the vertical direction inside the fixed core and having a lower end that is open toward the lower surface of the fixed core, and a second horizontal press flow path connected to an upper end of the second vertical press flow path and extending in the horizontal direction toward the inner circumferential surface of the fixed core to be connected to the first horizontal press flow path; and
the one or more vacuum connection flow paths and the one or more press connection flow paths do not intersect each other.

6. The wafer processing apparatus of claim 5, wherein the rotary joint further includes a vacuum flow path packing with an annular shape which is installed on the inner circumferential surface of the fixed core such that vacuum pressure of the one of more vacuum connection flow paths is prevented from being weakened due to a fluid flowing into the one or more vacuum connection flow paths between the first horizontal vacuum flow path and the second vacuum horizontal flow path.

7. The wafer processing apparatus of claim 6, wherein:
a vacuum flow path packing seating groove, which is recessed in an annular shape, is formed in the inner circumferential surface of the fixed core;
the vacuum flow path packing includes a body portion which is inserted and seated in the vacuum flow path packing seating groove and has a through-hole formed such that the second horizontal vacuum flow path is not closed, and a lip portion which protrudes from the body portion toward the outer circumferential surface of the rotating core to be in contact with the outer circumferential surface of the rotating core without closing the first horizontal vacuum flow path; and
in a direction toward the outer circumferential surface of the rotating core in the horizontal direction, the lip portion of the vacuum flow path packing protrudes in the vertical direction to be inclined in a direction away from the first horizontal vacuum flow path.

8. The wafer processing apparatus of claim 5, wherein the rotary joint further includes a press flow path packing with an annular shape which is installed on an inner circumferential surface of the fixed core such that pneumatic pressure of the one or more press connection flow paths is prevented from being weakened due to a fluid leaking outward from the one or more press connection flow paths between the first horizontal press flow path and the second horizontal press flow path.

9. The wafer processing apparatus of claim 8, wherein:
a press flow path packing seating groove, which is recessed in an annular shape, is formed in the inner circumferential surface of the fixed core;
the press flow path packing includes a body portion which is inserted and seated in the press flow path packing seating groove and has a through-hole formed such that the second horizontal press flow path is not closed, and a lip portion which protrudes from the body portion toward an outer circumferential surface of the rotating core to be in contact with the outer circumferential surface of the rotating core without closing the first horizontal press flow path; and
in a direction toward the outer circumferential surface of the rotating core in the horizontal direction, the lip portion of the press flow path packing protrudes in the vertical direction to be inclined in a direction toward the first horizontal press flow path.

10. The wafer processing apparatus of claim 3, wherein the rotating core includes a ceramic coating layer stacked on an outer circumferential surface thereof to reduce friction when the rotating core rotates with respect to the fixed core.

11. The wafer processing apparatus of claim 3, wherein the rotary joint further includes a cooling case configured to surround an outer circumferential surface of the fixed core such that a cooling flow path, in which a refrigerant flows, is formed between the cooling case and the fixed core.

12. The wafer processing apparatus of claim 1, wherein the medium supply unit includes:
a medium supply pipe connected to the vacuum chuck unit to supply the inspection medium to the vacuum chuck unit; and
a pressure detection unit configured to measure pressure of the medium supply pipe.

13. The wafer processing apparatus of claim 12, wherein the medium supply unit further includes a flow rate detection unit configured to measure a flow rate of the inspection medium supplied from the medium supply pipe to the vacuum chuck unit.

14. The wafer processing apparatus of claim 1, further comprising:
a chucking module which is installed in the rotary chuck unit, positions and fixes the wafer assembly onto the vacuum chuck unit, and lowers the ring cover unit such that the ring cover unit presses an adhesive sheet between a retainer ring portion and the wafer.

15. The wafer processing apparatus of claim 14, wherein the chucking module includes:
- a chucking base installed in the rotary chuck unit;
- a chucking rotating part connected to the chucking base to rotate the chucking base;
- a plurality of first chucking link parts that move radially when the chucking base rotates;
- a plurality of wafer assembly restraining parts connected to the plurality of first chucking link parts and configured to press the retainer ring portion to be positioned and fixed to the vacuum chuck unit as the plurality of first chucking link parts move radially;
- a plurality of second chucking link parts that move radially when the chucking base rotates; and
- a plurality of cover restraining parts connected to the plurality of second chucking link parts and the ring cover unit to move the ring cover unit upward or downward in conjunction with movement of the plurality of second chucking link parts.

16. The wafer processing apparatus of claim 1, wherein the sealing ring includes:
- a sealing member which is accommodated in a sealing groove formed in the vacuum chuck unit and has a deformable space formed therein;
- a restraining ring portion installed in the sealing groove to fix the sealing member; and
- a connector portion connected to the deformable space such that the inspection medium is supplied to the deformable space.

17. The wafer processing apparatus of claim 1, wherein:
the wafer assembly further includes an adhesive sheet attached to the wafer to support the wafer, and a retainer ring portion coupled to an outer peripheral portion of the adhesive sheet the ring cover unit configured to press the adhesive sheet between the wafer and the retainer ring portion.

18. A method of controlling the wafer processing apparatus of claim 1, the method comprising:
- an inspection medium supply operation of driving the medium supply unit to supply the inspection medium into the sealing ring; and
- an inspection medium leakage detection operation of detecting whether the inspection medium supplied into the sealing ring leaks to an outside of the sealing ring.

19. The method of claim 18, further comprising:
- a sealing ring replacement operation of, when leakage of the inspection medium is detected in the inspection medium leakage detection operation, separating and removing the sealing ring from the vacuum chuck unit and installing another sealing ring in the vacuum chuck unit;
- a wafer mounting operation of fixing and mounting the wafer assembly on the vacuum chuck unit; and
- a wafer processing operation of spraying the processing solution onto the wafer of the wafer assembly to process the wafer.

20. The method of claim 18, further comprising:
- a wafer mounting operation of, when leakage of the inspection medium is not detected in the inspection medium leakage detection operation, fixing and mounting the wafer assembly on the vacuum chuck unit without replacing the sealing ring; and
- a wafer processing operation of spraying the processing solution onto the wafer of the wafer assembly to process the wafer.

* * * * *